(12) United States Patent
Yamagishi et al.

(10) Patent No.: US 9,368,384 B2
(45) Date of Patent: Jun. 14, 2016

(54) SUBSTRATE CONVEYING METHOD, RECORDING MEDIUM IN WHICH PROGRAM IS RECORDED FOR CAUSING SUBSTRATE CONVEYING METHOD TO BE EXECUTED, AND SUBSTRATE CONVEYOR

(75) Inventors: Daisuke Yamagishi, Iwate (JP); Katsuhiko Oyama, Iwate (JP); Masataka Sato, Iwate (JP); Yasushi Takeuchi, Iwate (JP)

(73) Assignee: Tokyo Electron Limited, Tokyo (JP)

( * ) Notice: Subject to any disclaimer, the term of this patent is extended or adjusted under 35 U.S.C. 154(b) by 1140 days.

(21) Appl. No.: 13/410,368

(22) Filed: Mar. 2, 2012

(65) Prior Publication Data

US 2012/0230805 A1  Sep. 13, 2012

(30) Foreign Application Priority Data

Mar. 8, 2011  (JP) .................................. 2011-050747

(51) Int. Cl.
| | |
|---|---|
| *B65H 1/00* | (2006.01) |
| *H01L 21/677* | (2006.01) |
| *H01L 21/67* | (2006.01) |
| *H01L 21/673* | (2006.01) |
| *H01L 21/687* | (2006.01) |
| *C23C 16/458* | (2006.01) |

(52) U.S. Cl.
CPC ...... *H01L 21/67757* (2013.01); *C23C 16/4583* (2013.01); *H01L 21/67109* (2013.01); *H01L 21/67303* (2013.01); *H01L 21/67309* (2013.01); *H01L 21/67781* (2013.01); *H01L 21/68707* (2013.01)

(58) Field of Classification Search
USPC ......................................... 414/805, 816, 217
See application file for complete search history.

(56) References Cited

U.S. PATENT DOCUMENTS

2009/0175705 A1 *  7/2009  Nakao et al. .................. 414/196

FOREIGN PATENT DOCUMENTS

| JP | 10-242237 | 9/1998 |
|---|---|---|
| JP | 2003-100727 | 4/2003 |
| JP | 2004-172374 | 6/2004 |
| JP | 2005-175413 | 6/2005 |
| JP | 2008-124091 | 5/2008 |
| JP | 2009-081259 | 4/2009 |
| JP | 2009-099918 | 5/2009 |

* cited by examiner

*Primary Examiner* — Saul Rodriguez
*Assistant Examiner* — Willie Berry, Jr.
(74) *Attorney, Agent, or Firm* — IPUSA, PLLC

(57) ABSTRACT

A substrate conveying method conveying a layered body having first and second substrates stacked with a spacer member provided between their respective bottom surfaces facing each other includes receiving the first substrate by holding the first substrate from below its bottom surface using a first holding mechanism provided on a side of a first fork provided above a second fork, and turning the first fork upside down and placing the received first substrate on the second fork; receiving the spacer member held in a substrate holding part by holding the spacer member from above using a second holding mechanism provided on the same side of the first fork as the first holding mechanism, and placing the received spacer member on the first substrate; and holding the second substrate from above its top surface using the first holding mechanism, and placing the received second substrate on the spacer member.

8 Claims, 25 Drawing Sheets

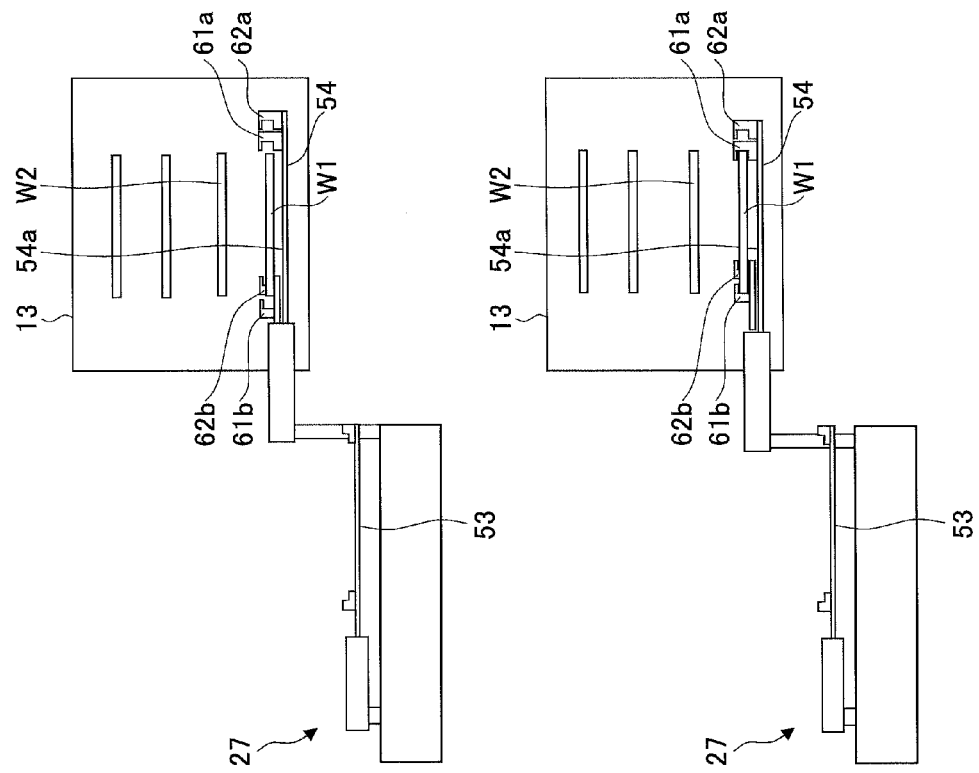
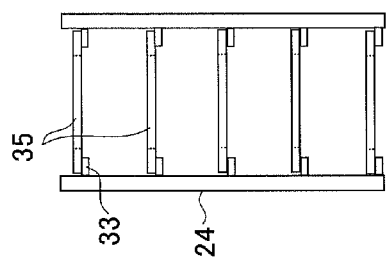
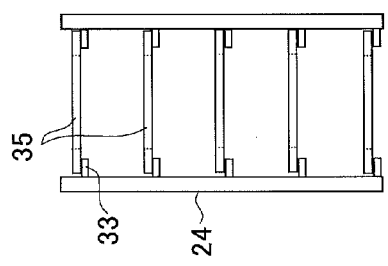
FIG.13A
FIG.13B

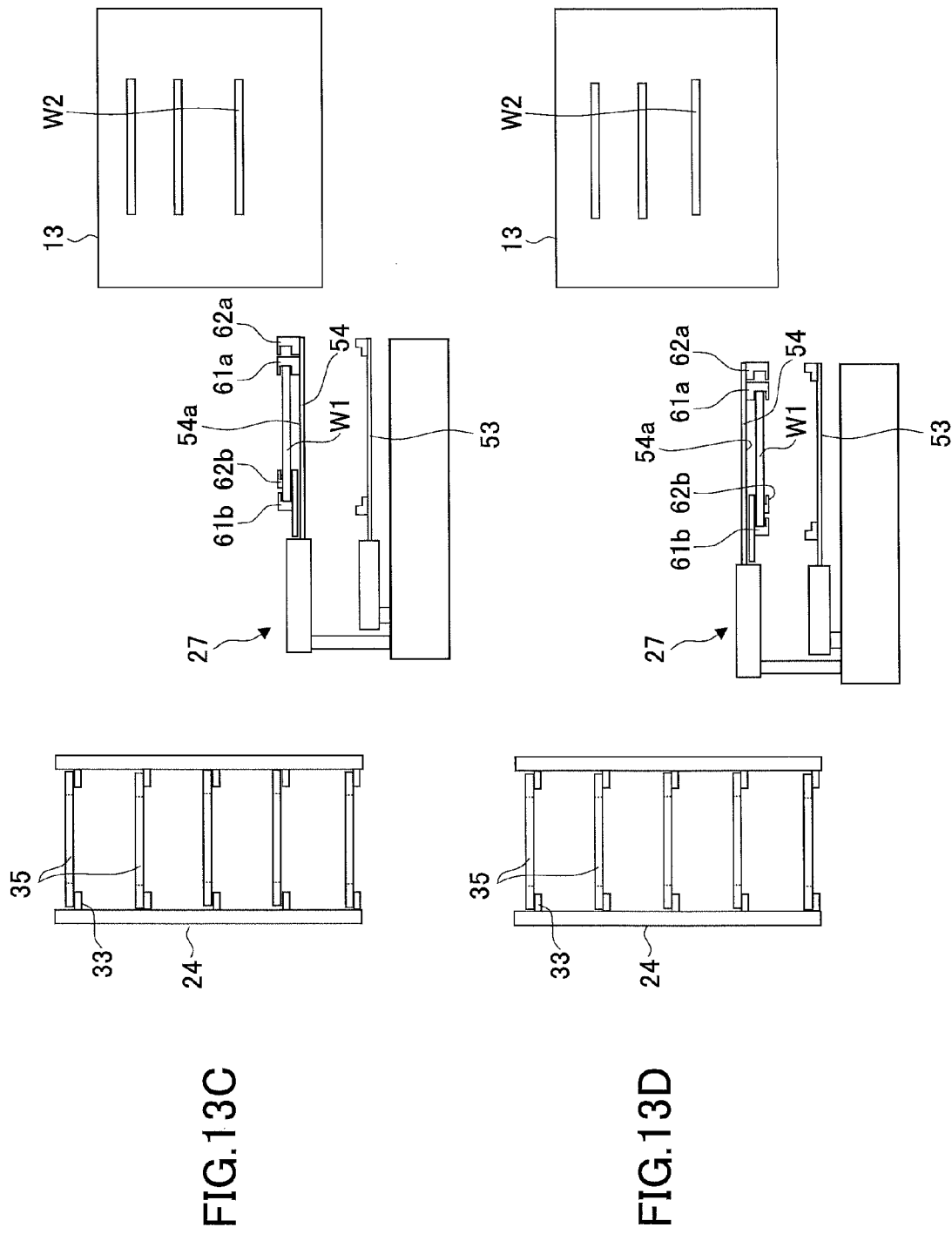

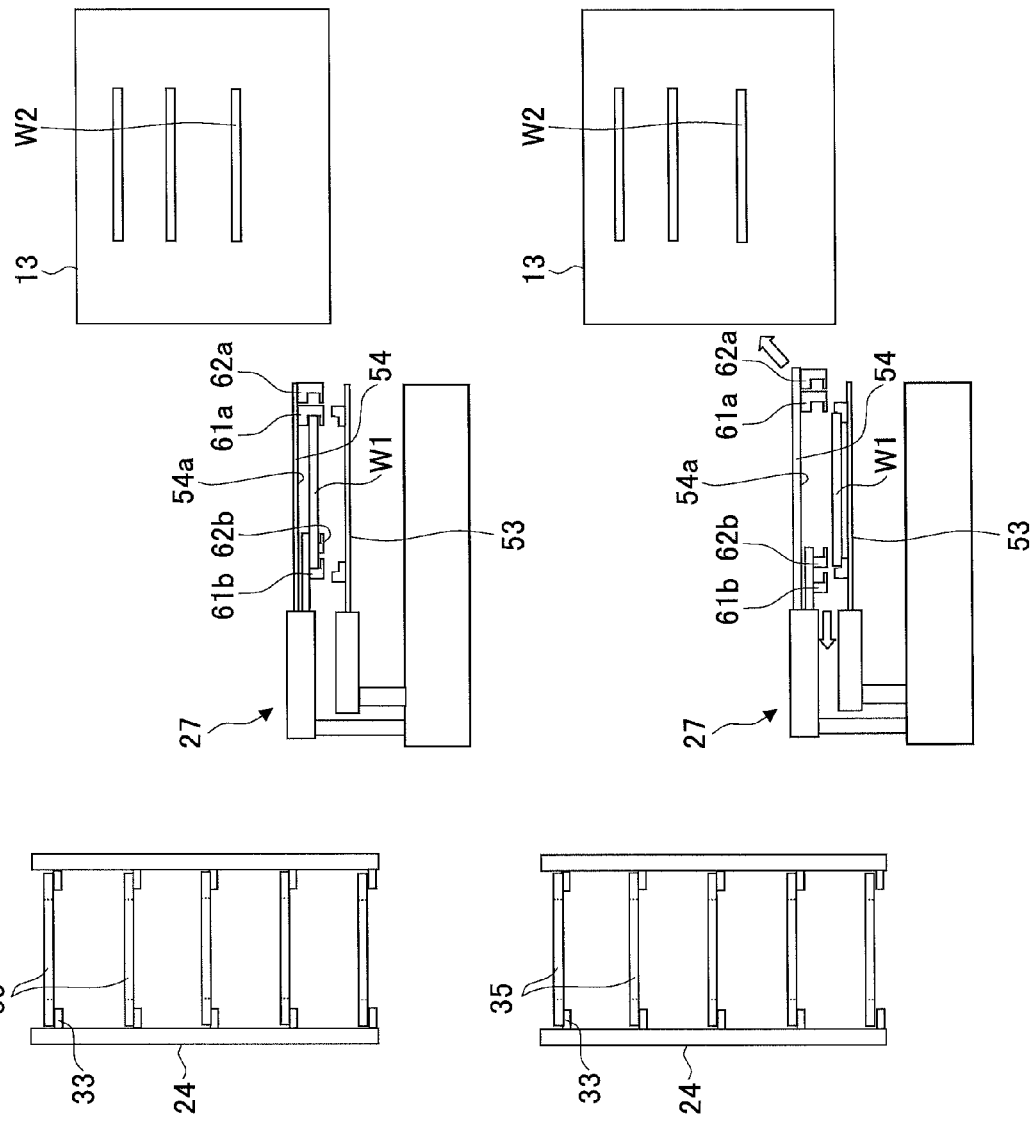

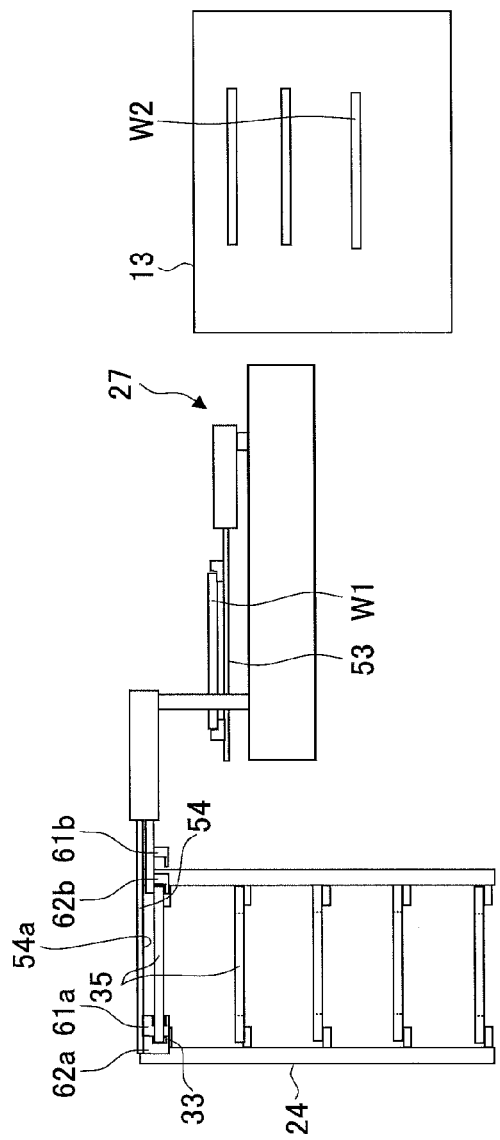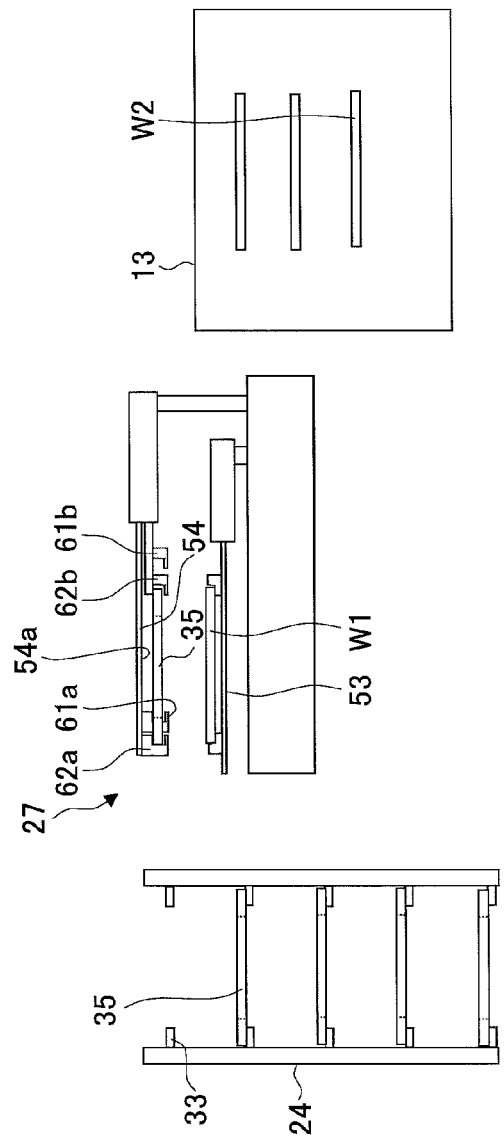

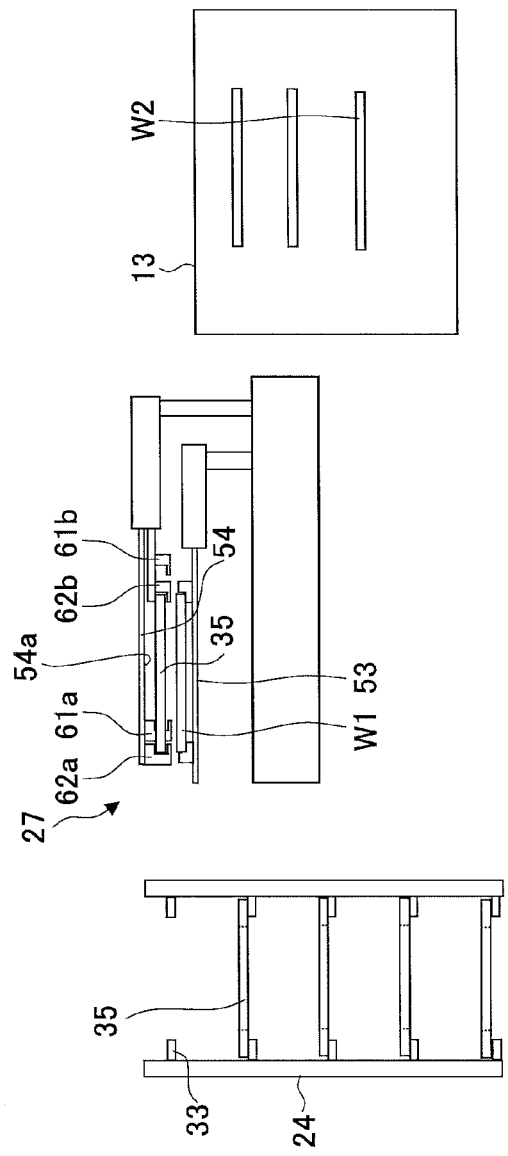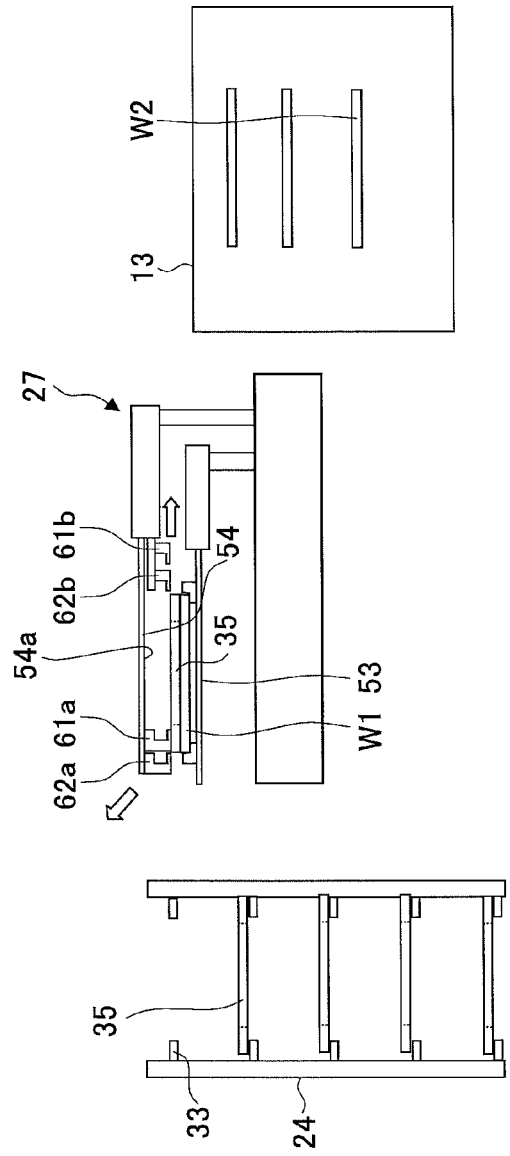
FIG.13K
FIG.13L

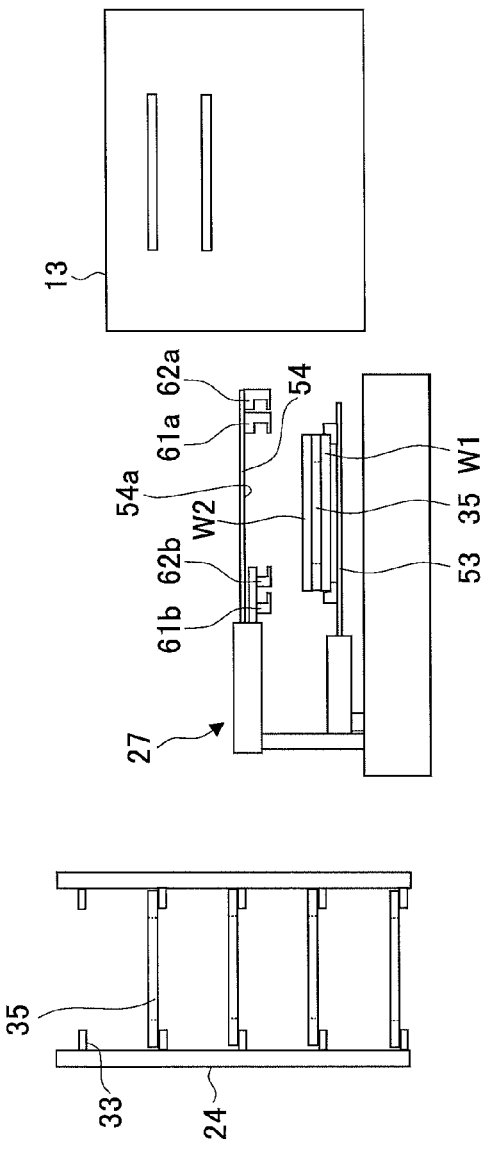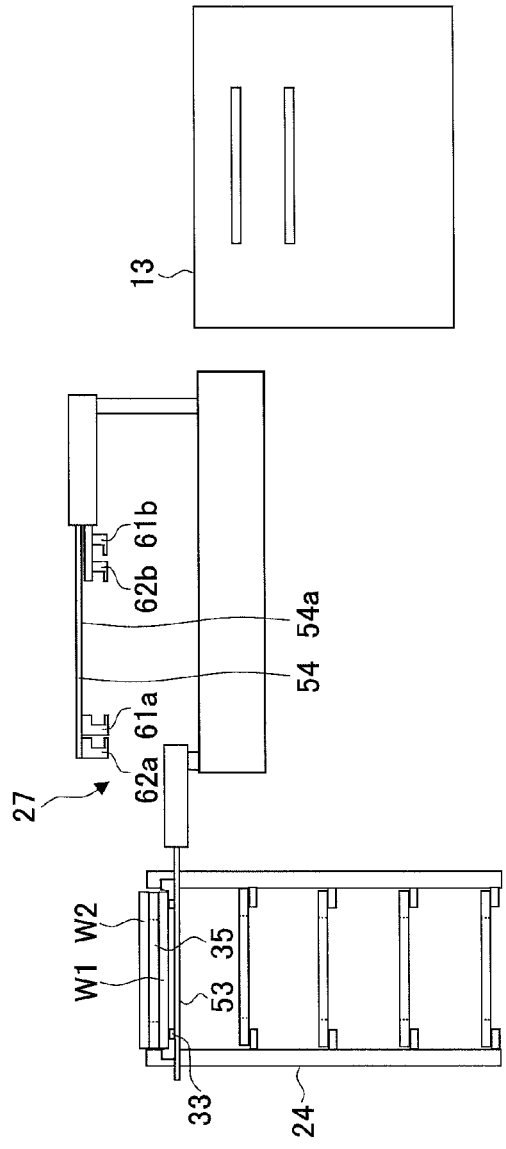

SUBSTRATE CONVEYING METHOD, RECORDING MEDIUM IN WHICH PROGRAM IS RECORDED FOR CAUSING SUBSTRATE CONVEYING METHOD TO BE EXECUTED, AND SUBSTRATE CONVEYOR

CROSS-REFERENCE TO RELATED APPLICATION

The present application is based upon and claims the benefit of priority of Japanese Patent Application No. 2011-050747, filed on Mar. 8, 2011, the entire contents of which are incorporated herein by reference.

BACKGROUND OF THE INVENTION

1. Field of the Invention

The present invention relates to a substrate conveying method for conveying a substrate, a recording medium in which a program is recorded for causing the substrate conveying method to be executed, and a substrate conveyor configured to convey a substrate.

2. Description of the Related Art

In manufacturing semiconductor devices, various processing apparatuses are used, for example, to subject a substrate to be processed (hereinafter also referred to as "substrate"), such as a semiconductor wafer, to processes such as oxidation, diffusion, chemical vapor deposition (CVD), etc. As one of such processing apparatuses, a film deposition apparatus is known that is formed of a vertical heat treatment apparatus capable of performing heat treatment on multiple substrates to be processed at a time.

The film deposition apparatus includes a boat, an elevation mechanism, and a transfer mechanism (substrate conveyor). The boat is a substrate holder configured to be carried into and out of a film deposition chamber while holding multiple substrates at predetermined holding intervals in a vertical direction. The elevation mechanism is provided in a loading area formed below the film deposition chamber. The elevation mechanism moves the boat up and down between the film deposition chamber and the loading area by moving up and down a lid body on which the boat is placed, the lid body closing the opening of the film deposition chamber. The transfer mechanism transfers substrates between the boat carried out to the loading area and a container configured to accommodate multiple substrates.

Film deposition methods using such a film deposition apparatus include a method of depositing a polyimide film on the surface of a substrate. A polyimide film obtained by depositing polyimide on the surface of a substrate may be used as an insulating film in a semiconductor device. As a method of depositing a polyimide film, a film deposition method is known that employs vapor deposition polymerization using, for example, pyromellitic dianhydride (PMDA) and 4,4'-oxydianiline (ODA) as raw material monomers.

In such a film deposition apparatus, in order to increase the number of substrates loadable in the boat, the boat may hold layered bodies at predetermined holding intervals in a vertical direction, the layered bodies each having two substrates stacked in layers with a spacer member provided between their respective bottom surfaces facing each other. (See, for example, Japanese Laid-Open Patent Application No. 2009-81259.)

Further, there is a substrate conveyor that clamps a substrate with a stopper member and a clamping part in conveying the substrate between a container configured to accommodate substrates and a substrate holding part. (See, for example, Japanese Laid-Open Patent Application No. 2009-99918.) According to the substrate conveyor of Japanese Laid-Open Patent Application No. 2009-99918, the stopper member is provided at the distal end of a fork to come into contact with the periphery of the substrate, and the clamping part is provided on the fork on its proximal end side to be movable back and forth, and is configured to clamp the substrate by pushing the substrate toward the stopper member.

SUMMARY OF THE INVENTION

According to an embodiment of the present invention, a substrate conveying method conveying a layered body having a first substrate and a second substrate stacked in layers with a spacer member provided between respective bottom surfaces thereof facing each other includes receiving the first substrate accommodated in an accommodating part by holding the first substrate from below the bottom surface thereof using a first holding mechanism provided on a side of a first fork provided above a second fork, and turning the first fork upside down and placing the received first substrate on the second fork; receiving the spacer member held in a substrate holding part by holding the spacer member from above the spacer member using a second holding mechanism provided on the same side of the first fork as the first holding mechanism, and placing the received spacer member on the first substrate placed on the second fork; and holding the second substrate accommodated in the accommodating part from above a top surface thereof using the first holding mechanism, and placing the received second substrate on the spacer member placed over the second fork.

According to another embodiment of the present invention, a non-transitory computer-readable recording medium has an executable program recorded thereon, the program instructing a computer processor to execute the substrate conveying method as set forth above.

According to another embodiment of the present invention, a substrate conveyor includes a first fork configured to move toward and away from a substrate holding part and to transfer a layered body to and from the substrate holding part, the layered body having two substrates stacked in layers with a spacer member provided between respective bottom surfaces thereof facing each other; a second fork provided above the first fork, the second fork being configured to move toward and away from each of a accommodating part accommodating the substrates and the substrate holding part, to turn upside down, to transfer the substrates one by one between the accommodating part and the first fork, and to transfer the spacer member between the substrate holding part and the first fork; a first holding mechanism provided on a side of the second fork and configured to hold the substrates one at a time from above or below the substrates; and a second holding mechanism provided on the same side of the second fork as the first holding mechanism and configured to hold the spacer member from above the spacer member.

The object and advantages of the present invention will be realized and attained by means of the elements and combinations particularly pointed out in the claims.

It is to be understood that both the foregoing general description and the following detailed description are exemplary and explanatory and not restrictive of the invention as claimed.

BRIEF DESCRIPTION OF THE DRAWINGS

The accompanying drawings, which are incorporated in and constitute a part of the specification, illustrate embodiments of the invention, and together with the general description given above and the detailed description of the embodiments given below, serve to explain the principles of the invention, in which.

DETAILED DESCRIPTION OF THE PREFERRED EMBODIMENT

Figure 1:
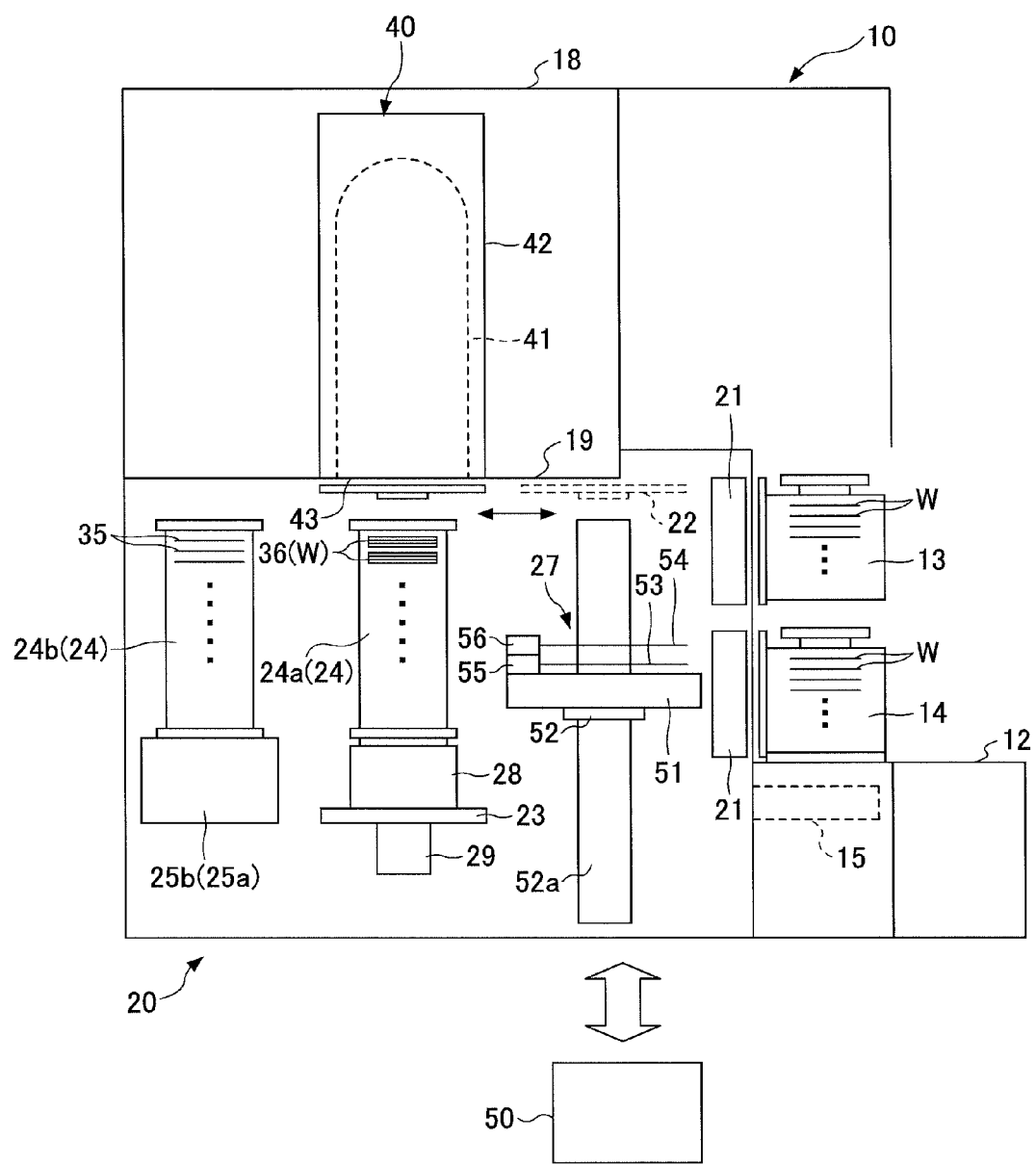
FIG. 1 is a schematic longitudinal cross-sectional view of a film deposition apparatus according to an embodiment.

However, the transfer mechanism, that is, the substrate conveyor, provided in the film deposition apparatus having a boat configured to hold layered bodies as described above has a problem as follows.

It is assumed that spacer members are accommodated in a container provided outside the film deposition apparatus and substrates are accommodated in substrate containers when no film deposition process is performed. In this case, one of connection openings for causing the substrate containers to communicate with the inside of the film deposition apparatus is connected to the spacer member container, so that the number of connection openings to be connected to the substrate containers is reduced. This causes wait time in switching substrate containers and conveying substrates, thus resulting in a longer conveyance time.

For example, a first substrate container is caused to communicate with the inside of the film deposition apparatus, and the communication between the first substrate container and the inside of the film deposition apparatus is cut off after transfer of substrates. Then the first substrate container is replaced with the next substrate container, and the next substrate container is caused to communicate with the inside of the film deposition apparatus to transfer substrates. At this point, after cutting off the communication between the first substrate container and the inside of the film deposition apparatus, a wait time is generated before the next substrate container communicates with the inside of the film deposition apparatus to have substrates ready for conveyance, thus resulting in a longer conveyance time.

According to an aspect of the invention, a substrate conveying method and a substrate conveyor are provided that reduce conveyance time in conveying layered bodies to and from a substrate holding part, where each of the layered bodies has two substrates stacked in layers with a spacer member provided between their respective bottom surfaces facing each other.

According to an aspect of the invention, it is possible to reduce conveyance time in conveying layered bodies to and from a substrate holding part, where each of the layered bodies has two substrates stacked in layers with a spacer member provided between their respective bottom surfaces facing each other.

Next, a description is given, with reference to the accompanying drawings, of an embodiment of the present invention.

First, a description is given, with reference to FIG. 1 through FIG. 7, of a film deposition apparatus according to the embodiment of the present invention.

The film deposition apparatus according to this embodiment includes a substrate conveyor according to an embodiment of the present invention, and is an application to a film deposition apparatus configured to deposit a film on multiple substrates to be processed (hereinafter referred to as "substrates" or "wafers W") in a batch process.

The film deposition apparatus according to this embodiment may be applied to a film deposition apparatus configured to deposit a polyimide film on a substrate held in a film deposition chamber by feeding the substrate with a first raw material gas, which is, for example, vaporized pyromellitic dianhydride (hereinafter abbreviated as "PMDA"), and a second raw material gas, which is, for example, vaporized 4,4'-oxydianiline (hereinafter, abbreviated as "ODA").

Figure 2:
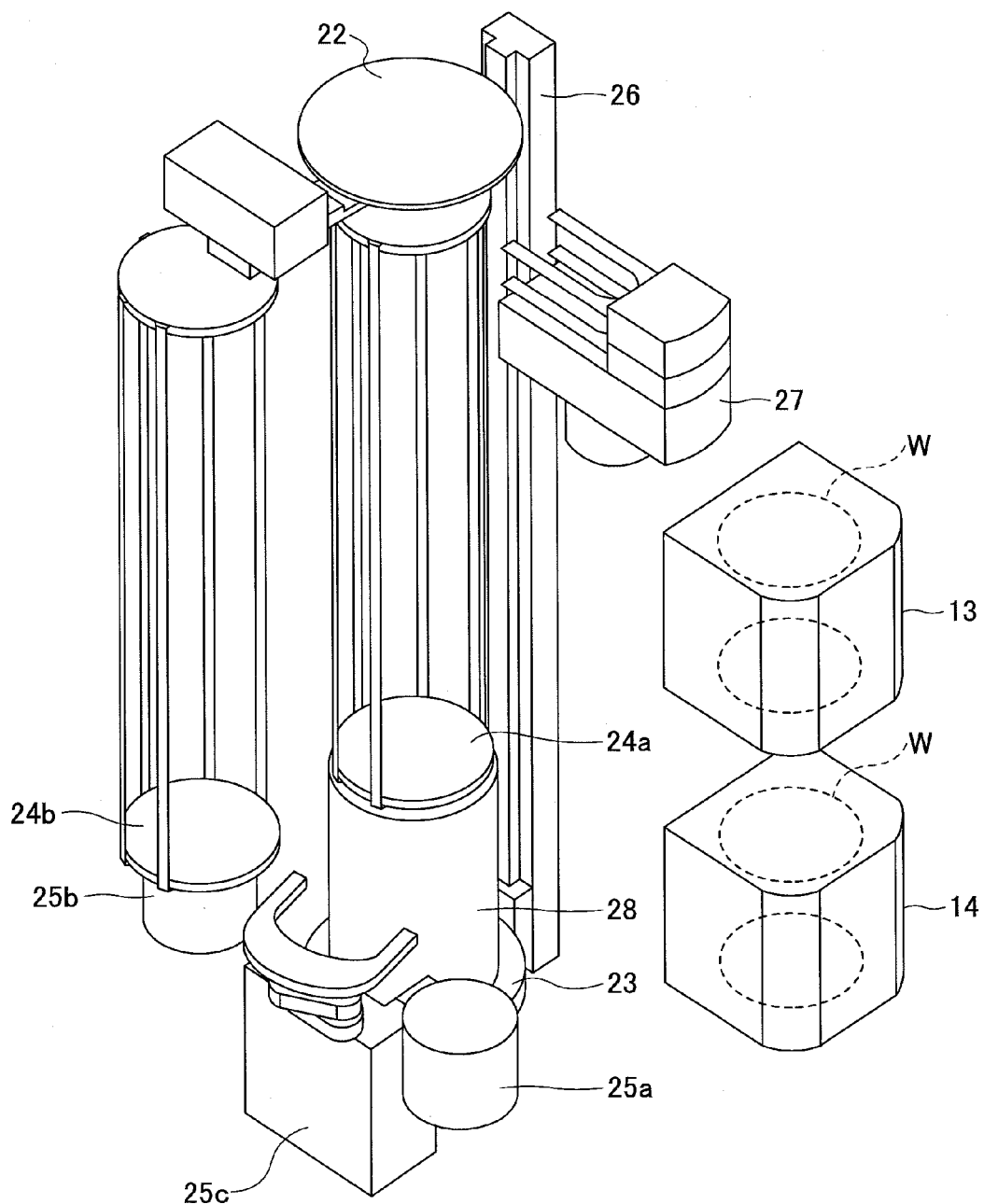
FIG. 2 is a schematic perspective view of a loading area according to the embodiment.
Figure 3:
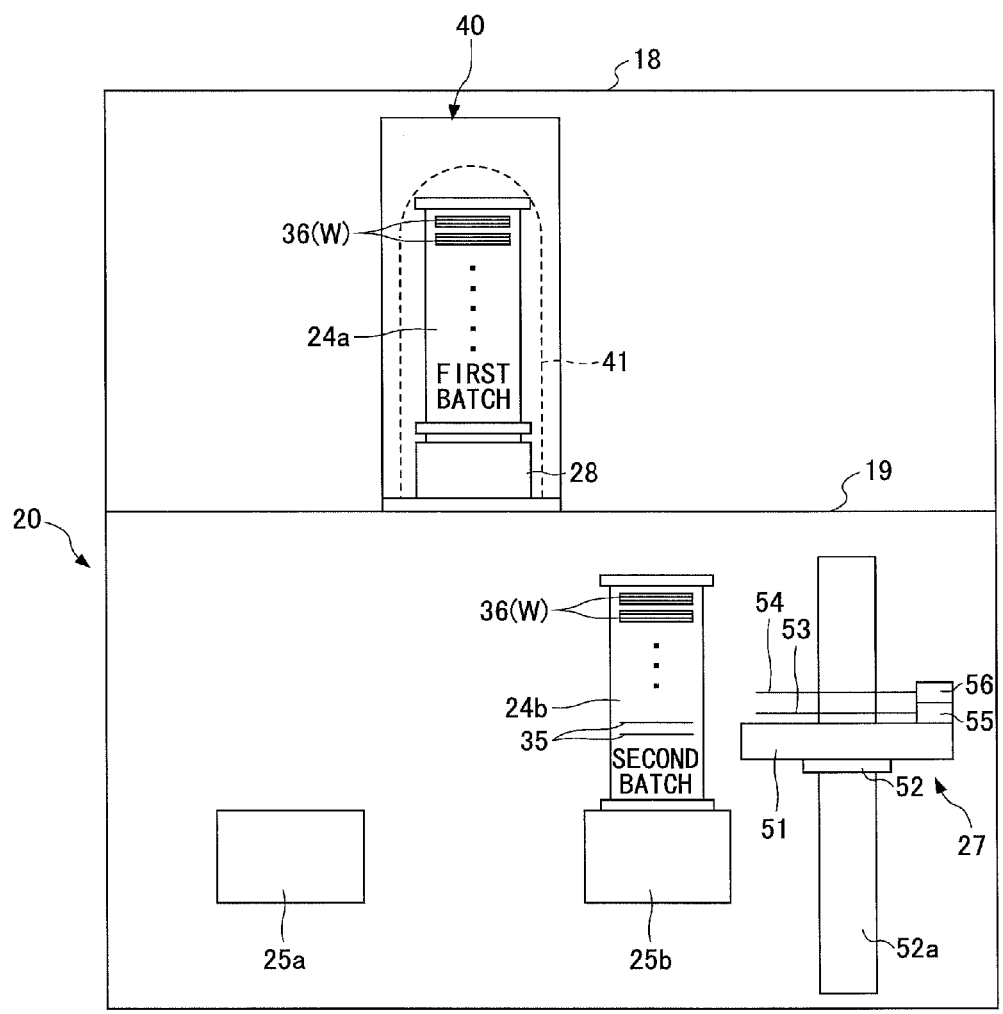
FIG. 3 is a diagram illustrating the state of wafers of a subsequent batch when wafers of the preceding batch are under a film deposition process in a film deposition chamber according to the embodiment.
Figure 4:
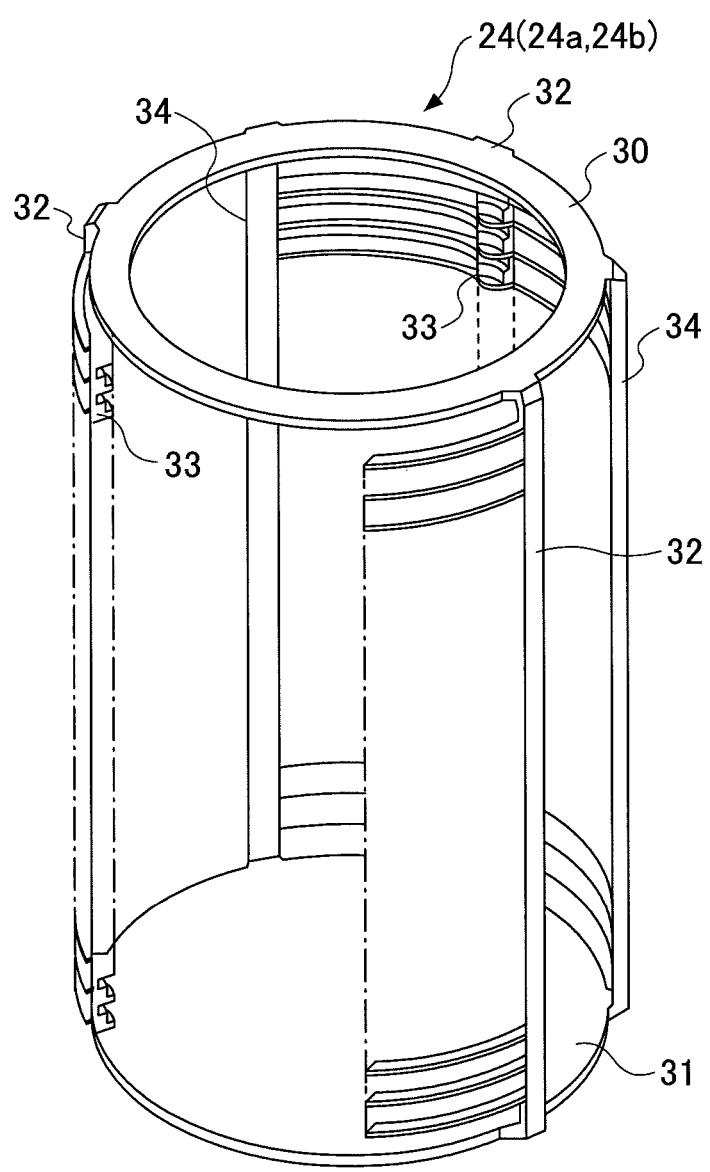
FIG. 4 is a perspective view of a boat according to the embodiment.
Figure 5:
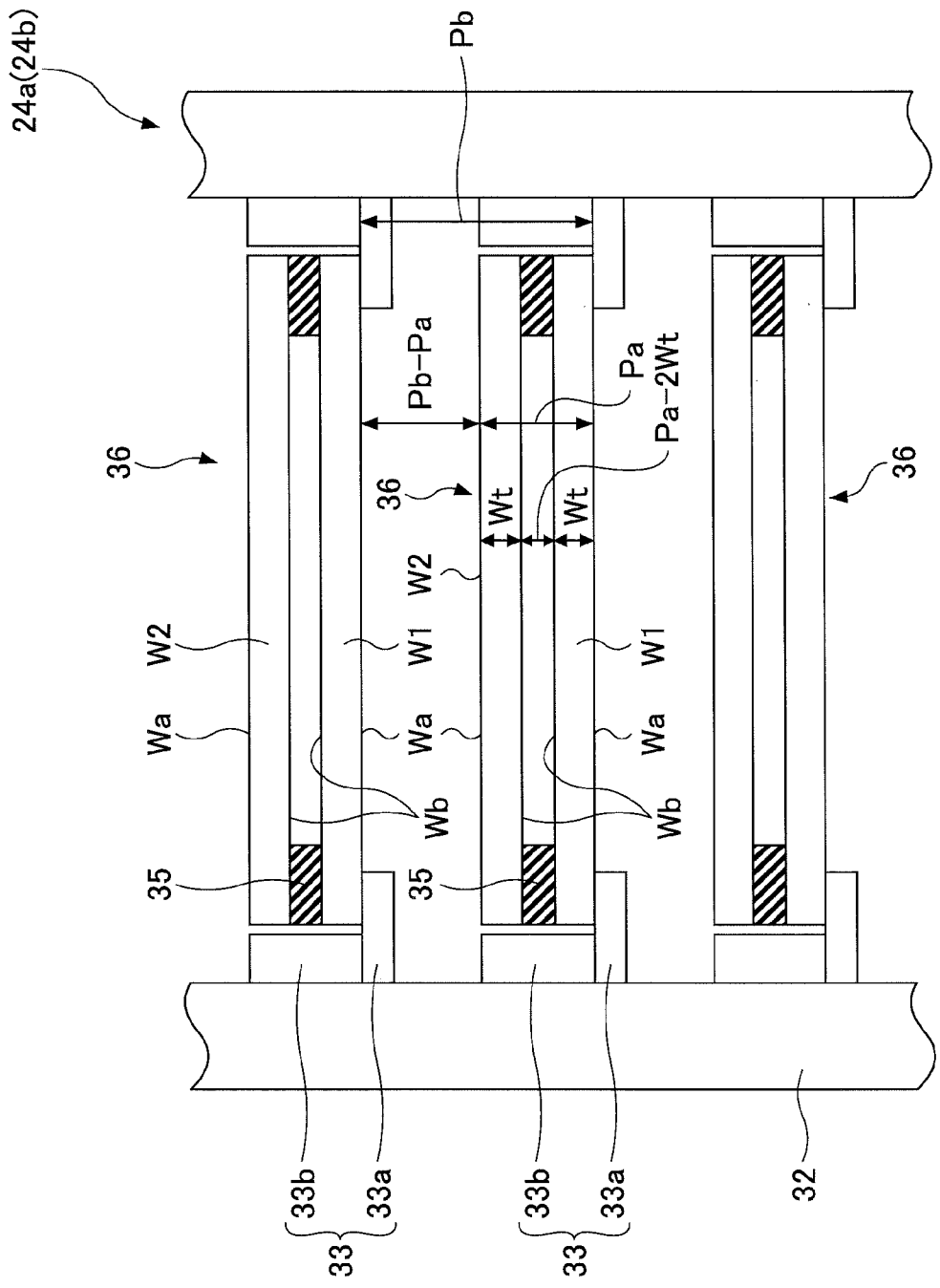
FIG. 5 is a cross-sectional view of the boat loaded with double-substrate units according to the embodiment.
Figure 6:
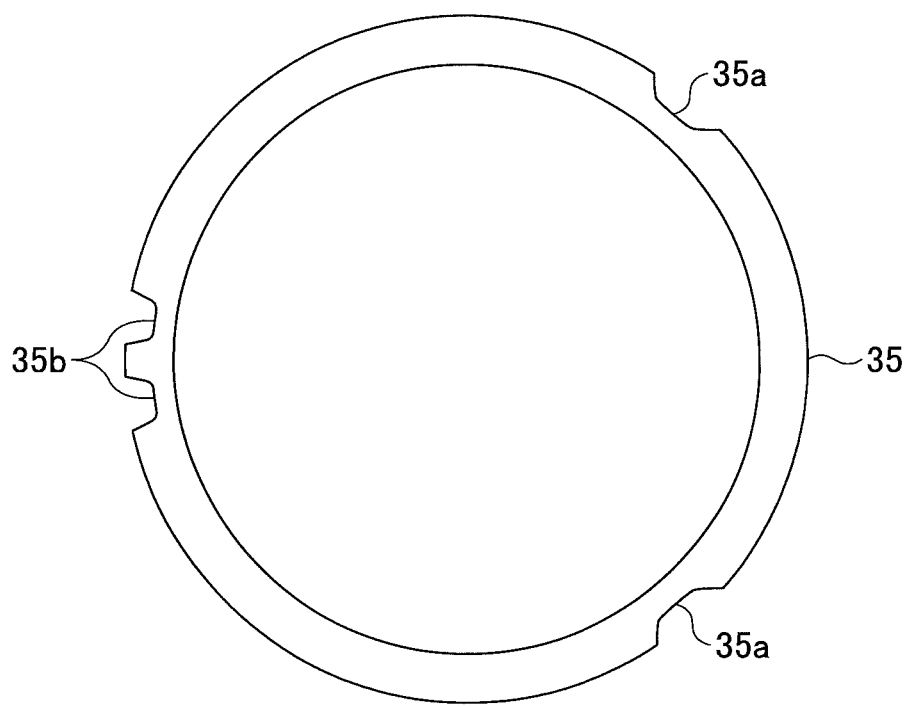
FIG. 6 is a schematic plan view of a spacer member according to the embodiment.
Figure 7:
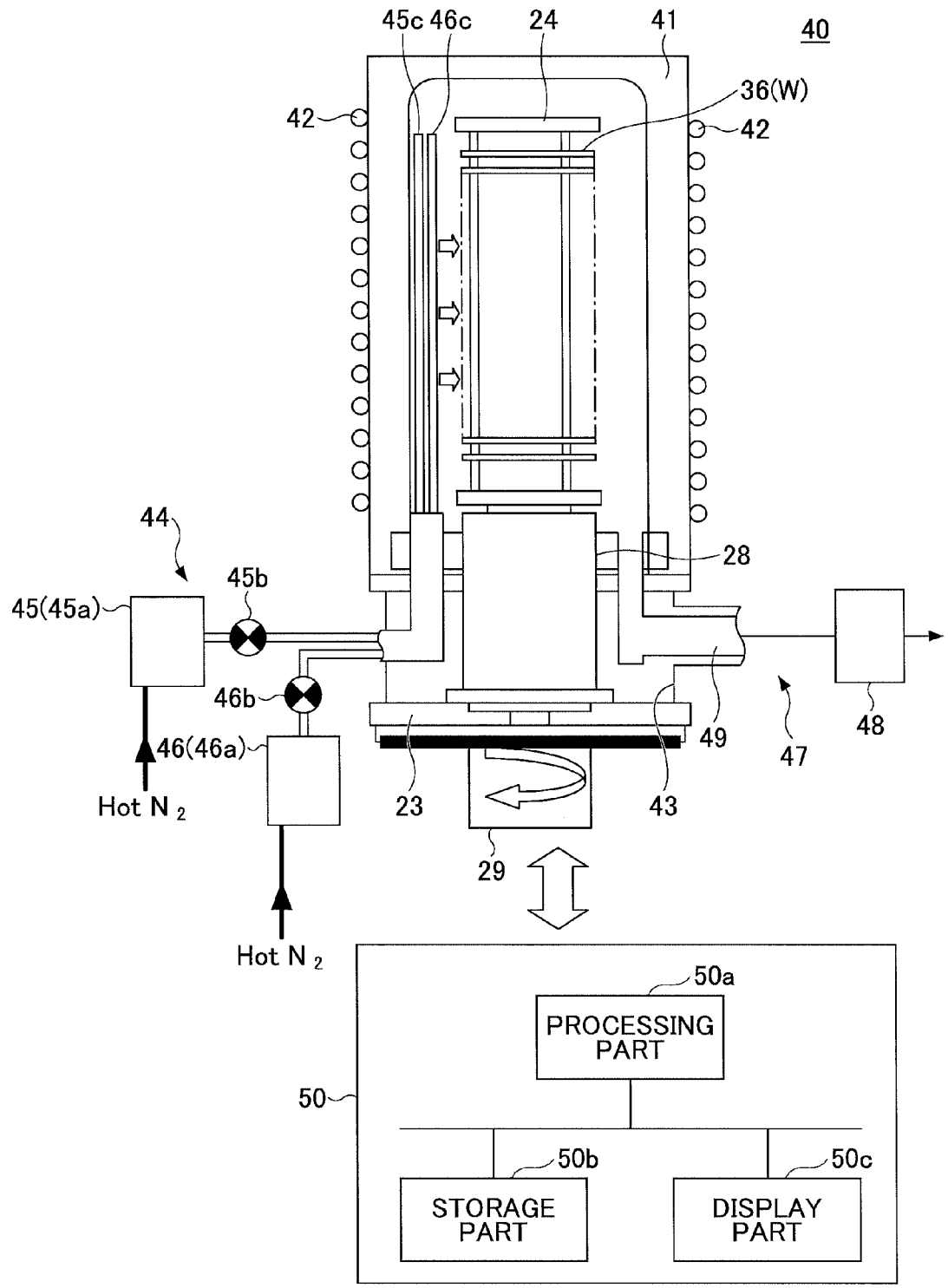
FIG. 7 is an enlarged, partially cross-sectional view of the film deposition chamber and its neighborhood according to the embodiment.

FIG. 1 is a schematic longitudinal cross-sectional view of a film deposition apparatus 10 according to this embodiment. FIG. 2 is a schematic perspective view of a loading area 20. FIG. 3 is a diagram illustrating the state of the wafers W of a subsequent batch (second batch) when the wafers W of the preceding batch (first batch) are under a film deposition process in a film deposition chamber 40. FIG. 4 is a perspective view of a boat 24. FIG. 5 is a cross-sectional view of the boat 24 loaded with double-substrate units 36. FIG. 6 is a schematic plan view of a spacer member 35. FIG. 7 is an enlarged, partially cross-sectional view of the film deposition chamber 40 and its neighborhood.

As illustrated in FIG. 1, the film deposition apparatus 10 includes a placement table (load port) 12, a housing 18, and a control part 50.

The placement table 12 is provided on the front side of the housing 18. The housing 18 includes the loading area (work area) 20 and the film deposition chamber 40. The loading area 20 is provided in a lower part of the housing 18. The film deposition chamber 40 is provided above the loading area 20 in the housing 18. Further, a base plate 19 is provided between the loading area 20 and the film deposition chamber 40.

The base plate 19 is, for example, a stainless steel base plate for providing a reaction tube 41 of the film deposition chamber 40. An opening, which is not graphically illustrated, is formed in the base plate 19 to allow insertion of the reaction tube 41 from bottom up.

The placement table 12 is for carrying the wafers W into and out of the housing 18. Containers 13 and 14 are placed on the placement table 12. That is, the containers 13 and 14 are provided outside the housing 18. The containers 13 and 14 are closable containers (front-opening unified pods or FOUPs) having a detachable lid, which is not graphically illustrated, on the front and accommodate multiple, for example, approximately 50 wafers at predetermined intervals.

The containers 13 and 14 may correspond to an accommodating part according to an aspect of the invention.

Further, an aligning unit (aligner) 15 configured to align notches provided in the peripheries of the wafers W transferred by a transfer mechanism 27 in a single direction may be provided below the placement table 12. The aligning unit 15 may also align the spacer members 35 at the same rotational angle in the housing 18. The aligning unit 15 may correspond to an aligning mechanism according to an aspect of the present invention.

The loading area 20 is a work area for transferring the wafers W between the container 13 and the boat 24, carrying (loading) the boat 24 into the film deposition chamber 40, and carrying out (unloading) the boat 24 from the film deposition chamber 40. Door mechanisms 21, a shutter mechanism 22, a lid body 23, the boat 24, bases 25a and 25b, an elevation mechanism 26 (see FIG. 2), and the transfer mechanism 27 are provided in the loading area 20.

The lid body 23 and the boat 24 may correspond to a substrate holding part according to an aspect of the present invention. Further, the transfer mechanism 27 may correspond to a substrate conveyor according to an aspect of the present invention.

The door mechanisms 21 are configured to remove the lids of the containers 13 and 14 to cause the containers 13 and 14 to communicate with and be open to the inside of the loading area 20.

The shutter mechanism 22 is provided in an upper part of the loading area 20. The shutter mechanism 22 is so provided as to cover (or close) an opening 43 of the film deposition chamber 40 to control or prevent a release of the heat inside the film deposition chamber 40 at high temperature to the loading area 20 through the opening 43 when the lid body 23 is open.

The lid body 23 includes a heat insulating tube 28 and a rotation mechanism 29. The heat insulating tube 28 is provided on the lid body 23. The heat insulating tube 28 prevents the boat 24 from being cooled through a transfer of heat with the lid body 23, and keeps heat in the boat 24. The rotation mechanism 29 is attached to the bottom of the lid body 23. The rotation mechanism 29 causes the boat 24 to rotate. The rotating shaft of the rotation mechanism 29 is so provided as to pass through the lid body 23 in a hermetic manner to rotate a rotating table, which is not graphically illustrated, provided on the lid body 23.

The above-described aligning mechanism that aligns the spacer members 35 at the same rotational angle is not limited to the aligning unit 15. For example, a sensor including a light-emitting element and a light-receiving element may be provided near the boat 24, and an alignment mark for aligning the spacer members 35 at the same rotational angle may be formed on the spacer members 35. Then, the spacer members 35 may be aligned using the sensor and the alignment marks by causing the boat 24 to rotate a slight angle by the rotation mechanism 29 when the spacer members 35 are held in the boat 24.

The elevation mechanism 26 drives the lid body 23 to move up and down when the boat 24 is carried into the film deposition chamber 40 from the loading area 20 and out of the film deposition chamber 40 to the loading area 20. The lid body 23 is so provided as to come into contact with the opening 43 to hermetically close the opening 43 when the lid body 23, moved upward by the elevation mechanism 26, has been carried into the film deposition chamber 40. The boat 24 placed on the lid body 23 may hold the wafers W in the film deposition chamber 40 in such a manner as to allow the wafers W to rotate in a horizontal plane.

The film deposition apparatus 10 may have multiple boats 24. In this embodiment, a description is given below, with reference to FIG. 2, of a case where the film deposition apparatus 10 includes two boats 24a and 24b, which may also be collectively referred to as the "boat 24" when there is no need to make a distinction between the boats 24a and 24b in particular.

The boats 24a and 24b are provided in the loading area 20. The bases 25a and 25b and a boat conveying mechanism 25c are provided in the loading area 20. The bases 25a and 25b are placement tables onto which the boats 24a and 24b are transferred from the lid body 23, respectively. The boat conveying mechanism 25c transfers the boats 24a and 24b from the lid body 23 to the bases 25a and 25b, respectively.

As illustrated in FIG. 3, the wafers W of the subsequent batch (second batch) may be transferred from the container 13 to the boat 24b in the loading area 20 when the boat 24a loaded with the wafers W of the preceding batch (first batch) has been carried into the film deposition chamber 40 and is under a film deposition process. This allows the boat 24b loaded with the wafers W of the subsequent batch (second batch) to be carried into the film deposition chamber 40 immediately after the boat 24a is carried out of the film deposition chamber 40 after completion of the step of depositing a film on the wafers W of the preceding batch (first batch). As a result, it is possible to reduce time (tact time) for a film deposition process and to reduce manufacturing cost.

The boats 24a and 24b are made of, for example, quartz, and are configured to have the wafers W, which are large, for example, 300 mm in diameter, loaded in a horizontal position at predetermined intervals (with predetermined pitch width) in a vertical direction. For example, as illustrated in FIG. 4, the boats 24a and 24b have multiple, for example, three columnar supports 32 are provided between a top plate 30 and a bottom plate 31. The columnar supports 32 are provided with claw parts 33 for holding the wafers W. Further, auxiliary columns 34 may suitably be provided together with the columnar supports 32.

The boats 24a and 24b may hold the multiple double-substrate units 36, each having two wafers W stacked in layers with the spacer member 35 provided between their respective bottom surfaces facing each other, at predetermined intervals in a vertical direction. The boats 24a and 24b may hold the multiple double-substrate units 36 on the claw parts 33, and may hold the spacer members 35 in place of the double-substrate units 36 when not holding the double-substrate units 36. That is, the boats 24a and 24b are used to accommodate the spacer members 35 in the housing 18 when the wafers W are not subjected to a film deposition process.

In this embodiment, a description is given below of a case where each of the double-substrate units 36 has two wafers W stacked in layers with the spacer member 35 having a ring shape being provided between the wafers W.

The double-substrate units 36 may correspond to layered bodies according to an aspect of the present invention.

As illustrated in FIG. 5, each of the claw parts 33 has a bottom portion 33a and a sidewall portion 33b, and has an L-shaped longitudinal cross-section perpendicular to the circumferential directions of the boat 24a (24b). With respect to each of the double-substrate units 36, the peripheral edge part of a lower-side wafer W1 whose bottom surface Wb facing upward (that is, whose top surface Wa facing downward) is supported by the bottom portions 33a of the corresponding claw parts 33. The spacer member 35 is stacked on the lower-side wafer W1, whose bottom side Wb has its peripheral edge part supported on the bottom portions 33a. An upper-side wafer W2 whose bottom surface Wb facing downward (that is, whose top surface Wa facing upward) is supported on the spacer member 35. The sidewall portions 33b are so provided as to be in proximity to the side surfaces of the lower-side wafer W1, the spacer member 35, and the upper-side wafer W2 of the double-substrate unit 36, and prevent a horizontal displacement of the double-substrate unit 36.

The lower-side wafer W1 may correspond to a first substrate according to an aspect of the present invention, and the upper-side wafer W2 may correspond to a second substrate according to an aspect of the present invention.

In addition to single wafers, bonded wafers formed by bonding multiple wafers may be used as the wafers W. Wafers, including those various wafers, having a thickness of, for example, 0.75 mm to 1.2 mm may be used.

As illustrated in FIG. 5 and FIG. 6, the spacer members 35 have a ring shape having an outside diameter substantially equal to and an inside diameter slightly smaller than the outside diameter of the wafers W. At the time of a film deposition process in the film deposition chamber 40, the spacer members 35 have their respective ring-shaped portions sandwiched between the peripheral edge parts of the corresponding lower-side and upper-side wafers W1 and W2, which are two wafers W having their respective bottom surfaces facing each other. This makes it possible to prevent a source gas entering the gap between the two wafers W1 and W2 having their respective bottom surfaces facing each other and depositing films on the bottom surfaces of the wafers W1 and W2. The spacer members 35 may be made of, for example, SiC, silicon, or quartz.

As illustrated in FIG. 6, the spacer member 35 includes cut parts 35a and 35b. As described below using FIGS. 11A through 11C, the cut parts 35a are so provided as to prevent the spacer member 35 from interfering with first claw parts 61a of a first holding mechanism 61 when the spacer member 35 is supported by a second holding mechanism 62. Further, the cut parts 35b are so provided as to prevent the spacer member 35 from interfering with first pressing parts 61b of the first holding mechanism 61 when the spacer member 35 is supported by the second holding mechanism 62.

The cut parts 35a and 35b may also serve as the above-described alignment mark. The claw parts 33 may be provided to correspond to the positions where the cut parts 35a and 35b are formed, and to have a tapered portion tapered along the circumferential directions of the spacer member 35. The spacer members 35 may be aligned at the same rotational angle with the cut parts 35a and 35b being held by the claw parts 33 while engaging the tapered portions.

As illustrated in FIG. 5, it is assumed that the thickness of each of the wafers W is Wt, the entire thickness of each of the double-substrate units 36 is Pa, and the vertical interval at which the double-substrate units 36 are held, that is, the interval between the vertically adjacent claw parts 33, is Pb. In this case, the interval between two vertically adjacent wafers W with their respective bottom surfaces facing each other is Pa-2 Wt, and the interval between two vertically adjacent wafers W with their respective top surfaces facing each other is Pb—Pa. In this arrangement, Pa-2 Wt is preferably smaller than Pb—Pa. That is, preferably, the wafers W are vertically held so that the interval between two vertically adjacent wafers W with their respective bottom surfaces facing each other, Pa-2 Wt, is smaller than the interval between two vertically adjacent wafers W with their respective top surfaces facing each other, Pb—Pa.

Here, the thickness of the double-substrate unit 36, Pa, may be, for example, 3.3 mm, and the vertical interval at which the double-substrate units 36 are held (the interval between the vertically adjacent claw parts 33), Pb, may be, for example, 21 mm. In this case, the interval between two vertically adjacent wafers W with their respective top surfaces facing each other, Pb—Pa, may be 21−3.3=17.7 mm. On the other hand, in the case of supporting the wafers W so that two of the wafers W are accommodated at equal intervals in a 21 mm interval, which is the interval between the double-substrate units 36, Pb, as usual, the interval between two vertically adjacent wafers W is (21−0.9×2)/2=9.6 mm, which is smaller than 17.7 mm, letting the thickness of the wafer W, Wt, be 0.9 mm. Accordingly, by supporting the wafers W using the double-substrate units 36 so that the respective bottom surfaces of the wafers W face each other, it is possible to increase the gap between the top surface Wa of one wafer W and the top surface Wa of the other wafer W, so that it is possible to feed a sufficient amount of source gases onto the top surfaces Wa of the wafers W.

FIG. 7 is a schematic diagram illustrating the film deposition chamber 40, a feed mechanism 44, and an exhaust mechanism 47, where the film deposition chamber 40 is illustrated in a cross section.

The film deposition chamber 40 may be, for example, a vertical furnace that accommodates multiple substrates to be processed, such as thin disk-shaped wafers W, and performs a predetermined process such as CVD on the substrates to be processed. The film deposition chamber 40 includes the reaction tube 41 and a heater (heating device) 42.

The reaction tube 41 is made of, for example, quartz, has a vertically elongated shape, and has the opening 43 formed at the lower end. The heater 42 is so provided as to cover the periphery of the reaction tube 41, and may control heating so that the inside of the reaction tube 41 is heated to a predetermined temperature, for example, 100° C. to 1200° C.

The feed mechanism 44 includes a first source gas feeding part 45 and a second source gas feeding part 46. The first source gas feeding part 45 is connected to an injector 45c via a valve 45b. The second source gas feeding part 46 is connected to an injector 46c via a valve 46b.

The first source gas feeding part 45 includes a first vaporizer 45a configured to vaporize, for example, a PMDA source material. The first vaporizer 45a heats and vaporizes a first source material formed of PMDA, and feeds a first source gas formed of PMDA gas obtained by the vaporization together with a first carrier gas formed of nitrogen gas (N2 gas) into the reaction tube 41.

The second source gas feeding part 46 includes a second vaporizer 46a configured to vaporize, for example, an ODA source material. The second vaporizer 46a heats and vaporizes a second source material formed of ODA, and feeds a second source gas formed of ODA gas obtained by the vaporization together with a second carrier gas formed of nitrogen gas (N2 gas) into the reaction tube 41. The second carrier gas conveys the second source gas formed of ODA gas and also for bubbling ODA in a liquid state.

The exhaust mechanism 47 includes an exhaust device 48 and an exhaust pipe 49 provided in the film deposition chamber 40. The exhaust mechanism 47 is configured to evacuate gas from inside the film deposition chamber 40.

Openings (not graphically illustrated) are provided on side surfaces of the injectors 45c and 46c so that the PMDA gas and the ODA gas, generated by the first source gas feeding part 45 and the second source gas feeding part 46, respectively, are fed onto the wafers W as indicated by arrows in FIG. 7. The fed PMDA gas and ODA gas are subjected to a vapor deposition polymerization reaction on the wafers W so that a polyimide film is deposited on the wafers W. Parts of the PMDA gas and the ODA gas that do not contribute to the deposition of the polyimide film are let to flow to be discharged outside the film deposition chamber 40 via the exhaust pipe 49. Further, the boat 24 is driven to rotate by the rotation mechanism 29 so that the polyimide film is deposited evenly on the wafers W.

The control part 50 includes, for example, a processing part 50a, a storage part 50b, and a display part 50c, which are electrically interconnected. The processing part 50a is, for example, a computer including a central processing unit (CPU). The storage part is a computer-readable recording medium formed of, for example, hard disks, on which a program for causing the processing part 50a to execute various processes is recorded. The display part 50c is formed of, for example, a computer screen (display). The processing unit 50a reads a program recorded in the storage part 50b and transmits control signals to components of the boat 24 (substrate holding part), the transfer mechanism 27, the feed mechanism 44, and the exhaust mechanism 47 in accordance with the program, thereby executing a substrate conveying method and a film deposition process to be described below.

Next, a description is given, with reference to FIG. 8 through FIGS. 11A through 11C, of the transfer mechanism 27.

Figure 8:
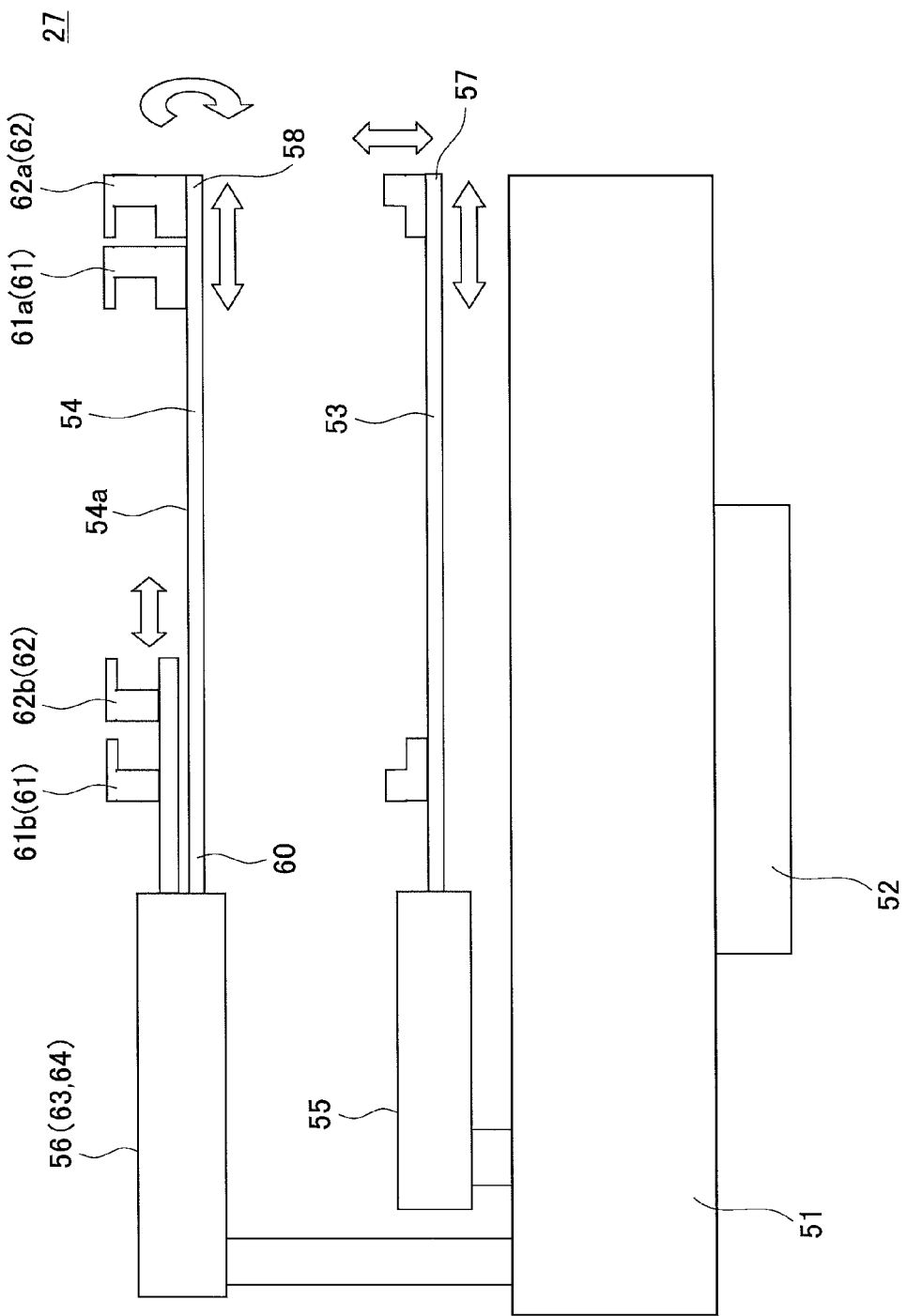
FIG. 8 is a side view of a transfer mechanism, schematically illustrating a configuration of the transfer mechanism according to the embodiment.
Figure 9A:
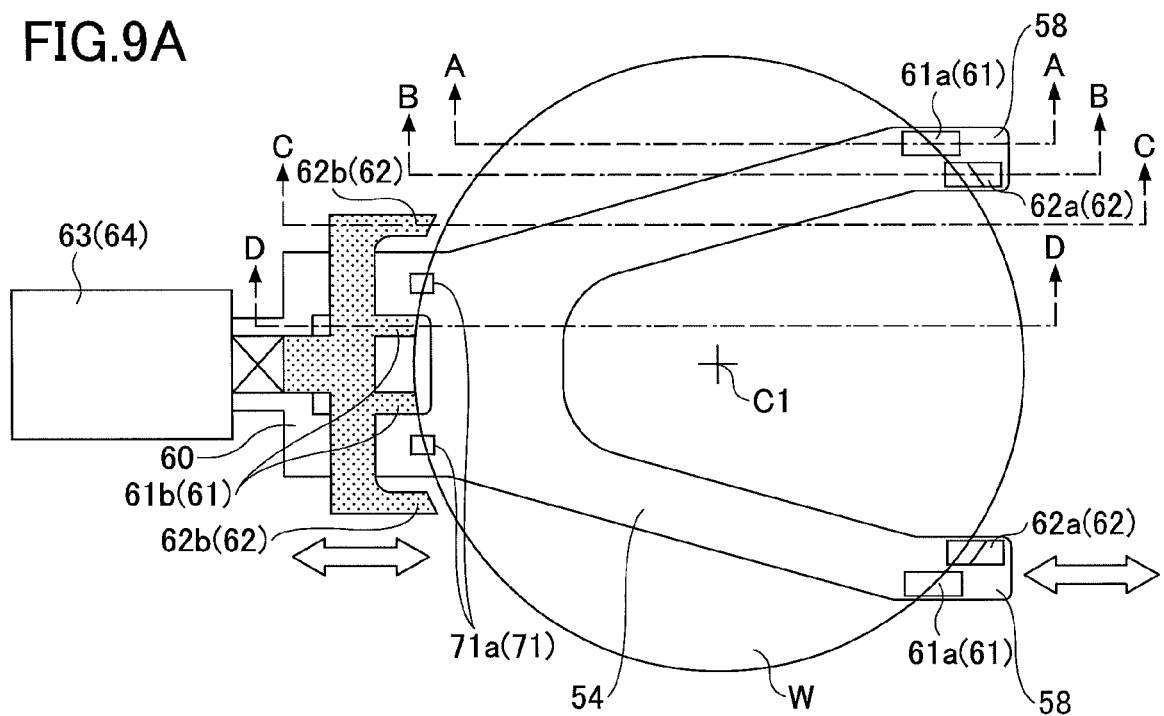
FIG. 9A is a plan view and FIGS. 9B and 9C are horizontal cross-sectional views, respectively, of an upper fork, schematically illustrating a state where the upper fork is supporting (holding) the wafer from below the wafer according to the embodiment.
Figure 9B:
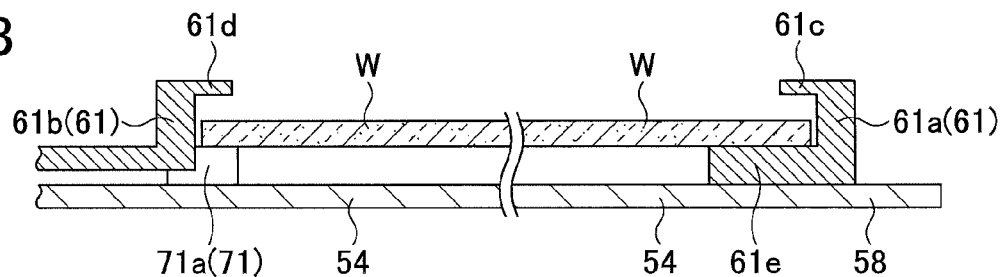
Figure 9C:
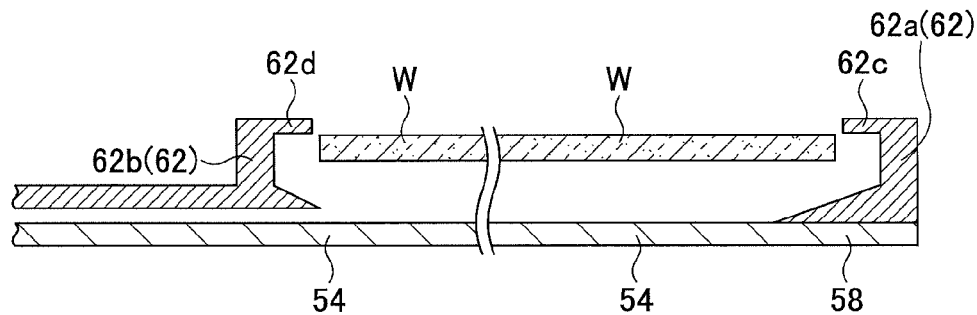
Figure 10A:
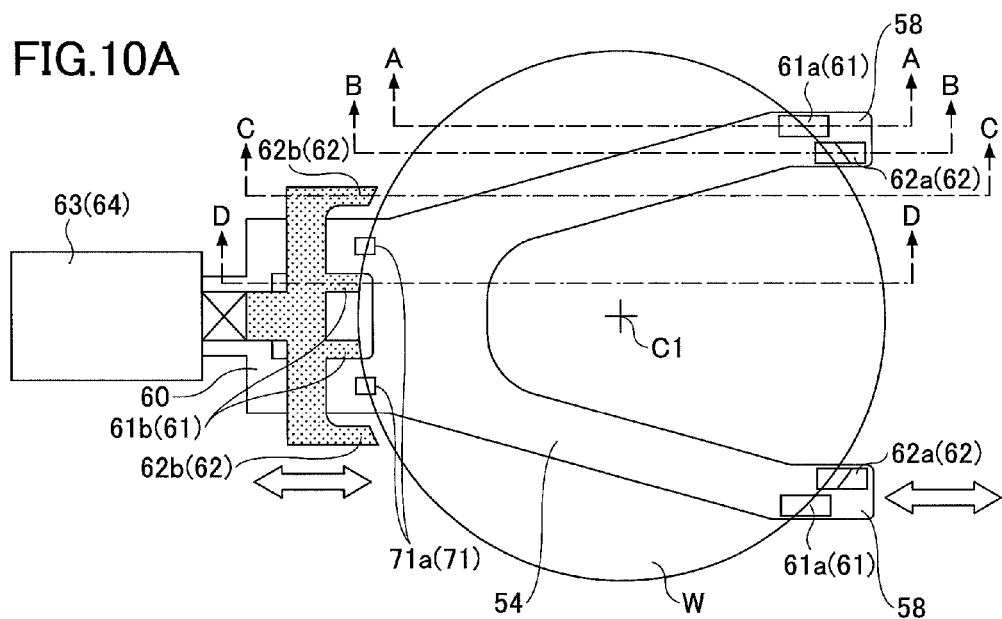
FIG. 10A is a bottom view and FIGS. 10B and 10C are horizontal cross-sectional views, respectively, of the upper fork, schematically illustrating a state where the upper fork is supporting (holding) the wafer from above the wafer according to the embodiment.
Figure 10B:
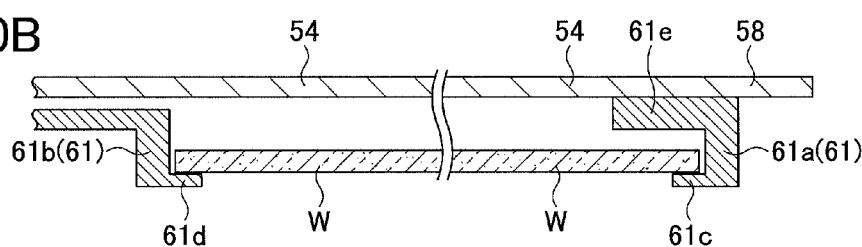
Figure 10C:
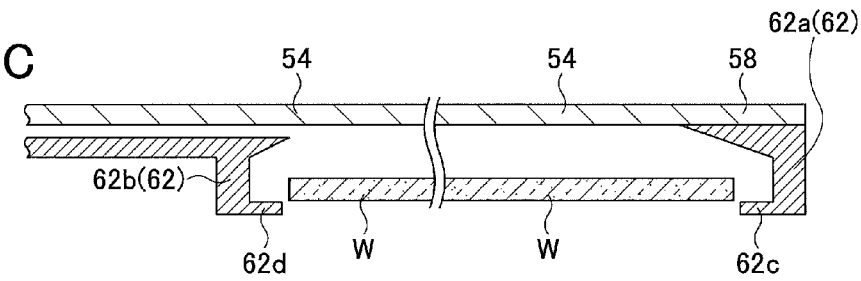
Figure 11A:
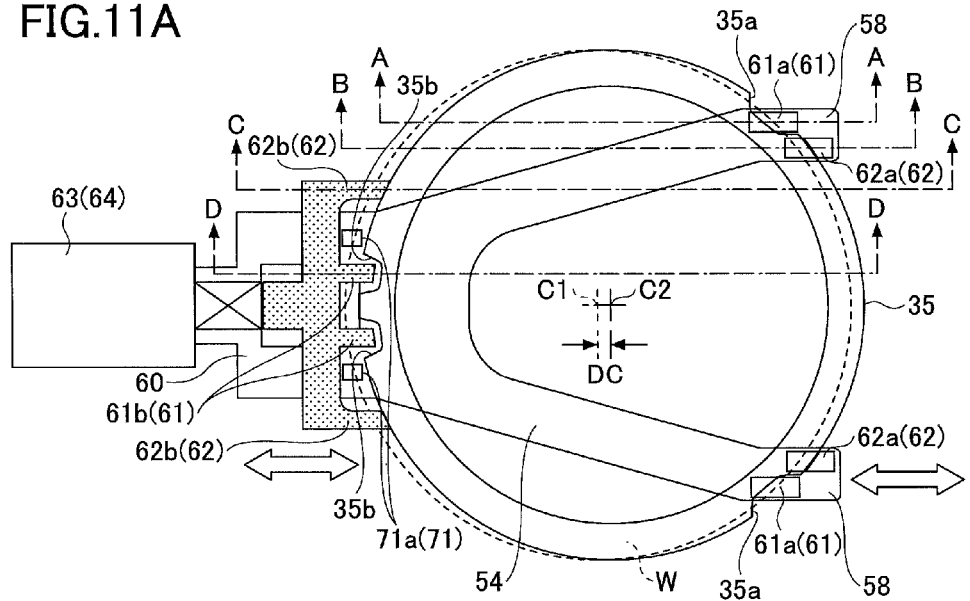
FIG. 11A is a plan view and FIGS. 11B and 11C are horizontal cross-sectional views, respectively, of the upper fork, schematically illustrating a state where the upper fork is supporting (holding) the spacer member from above the spacer member according to the embodiment.

FIG. 8 is a side view of the transfer mechanism 27, schematically illustrating a configuration of the transfer mechanism 27. FIG. 9A is a plan view and FIGS. 9B and 9C are horizontal cross-sectional views, respectively, of an upper fork 54, schematically illustrating a state where the upper fork 54 is supporting (holding) the wafer W from below the wafer W. FIG. 10A is a bottom view and FIGS. 10B and 10C are horizontal cross-sectional views, respectively, of the upper fork 54, schematically illustrating a state where the upper fork 54 is supporting (holding) the wafer W from above the wafer W. FIG. 11A is a plan view and FIGS. 11B and 11C are horizontal cross-sectional views, respectively, of the upper fork 54, schematically illustrating a state where the upper fork 54 is supporting (holding) the spacer member 35 from above the spacer member 35.

Figure 11B:
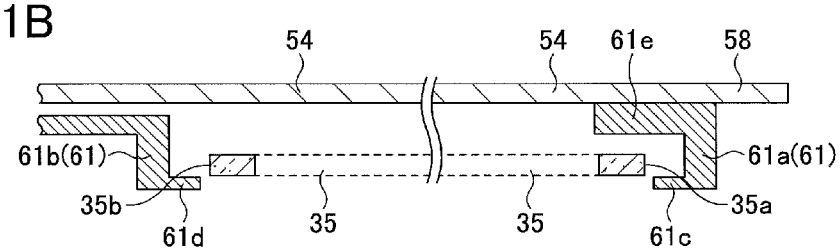
Figure 11C:
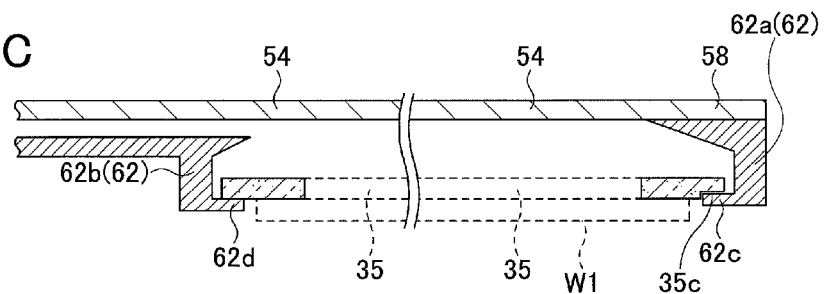

The right halves of FIGS. 9B, 10B, and 11B illustrate cross sections taken along line A-A in FIGS. 9A, 10A, and 11A, respectively, and the left halves of FIGS. 9B, 10B, and 11B illustrate cross sections taken along line D-D in FIGS. 9A, 10A, and 11A, respectively. The right halves of FIGS. 9C, 10C, and 11C illustrate cross sections taken along line B-B in FIGS. 9A, 10A, and 11A, respectively, and the left halves of FIGS. 9C, 10C, and 11C illustrate cross sections taken along line C-C in FIGS. 9A, 10A, and 11A, respectively.

The transfer mechanism 27 is configured to transfer the wafers W between the containers 13 and 14 and the boats 24a and 24b and to transfer the spacer members 35 to and from the boats 24a and 24b. The transfer mechanism 27 includes a base 51, an elevation mechanism 52, a lower fork 53, and the upper fork 54. The base 51 is so provided as to be turnable. The elevation mechanism 52 is, for example, so provided as to be vertically movable (movable upward and downward) along a rail 52a (FIG. 1) provided in a vertical position. The lower fork 53 is so provided as to be horizontally and vertically movable relative to the base 51. The upper fork 54 is so provided as to be horizontally movable relative to the base 51 and be turnable upside down.

The lower fork 53 and the upper fork 54 may correspond to a first fork and a second fork, respectively, according to an aspect of the invention while the lower fork 53 and the upper fork 54 may also correspond to a second fork and a first fork, respectively, according to another aspect of the invention. The lower fork 53 and the upper fork 54 may be provided so that one of the lower fork 53 and the upper fork 54 is vertically movable relative to the other. Accordingly, instead of the lower fork 53, the upper fork 54 may be so provided as to be vertically movable relative to the base 51.

The lower fork 53 is so provided as to be movable toward and away from the boat 24a or 24b loaded with the double-substrate units 36 by a movable body 55, and transfers the double-substrate units 36 to and from the boat 24a or 24b. On the other hand, the upper fork 54 is so provided as to be horizontally movable and movable toward and away from the container 13 accommodating the wafers W by a movable body 56, and transfers the wafers W to and from the container 13. Further, the upper fork 54 is so provided as to be movable toward and away from the container 14 accommodating the wafers W by the movable body 56, and transfers the wafers W to and from the container 14.

As illustrated in FIG. 9A, the upper fork 54 has a bifurcated end part 58. Like the upper fork 54, the lower fork 53 also has a bifurcated end part 57, although its graphical illustration is omitted.

The upper fork 54 includes the first holding mechanism 61, the second holding mechanism 62, and a support part 71.

The first holding mechanism 61 includes the two first claw parts 61a and the two first pressing parts 61b. The two first claw parts 61a are fixed on a surface 54a of the upper fork 54 one on each arm portion of the bifurcated end part 58. The upper fork 54 has the two first pressing parts 61b so provided on a proximal end 60 side and the surface 54a side as to be movable toward and away from the first claw parts 61a. The two first pressing parts 61b come into contact with the peripheral edge part of the wafer W and press the wafer W toward the first claw parts 61a so that the wafer W is held between the first claw parts 61a and the first pressing parts 61b. The two first pressing parts 61b may be provided as a unit.

The second holding mechanism 62 includes two second claw parts 62a and two second pressing parts 62b. The two second claw parts 62a are fixed on the surface 54a of the upper fork 54 one on each arm portion of the bifurcated end part 58. The upper fork 54 has the two second pressing parts 62b so provided on the proximal end 60 side and the surface 54a side as to be movable toward and away from the second claw parts 62a. The two second pressing parts 62b come into contact with the peripheral edge part of the spacer member 35 and press the spacer member 35 toward the second claw parts 62a so that the spacer member 35 is held between the second claw parts 62a and the second pressing parts 62b. The two second pressing parts 62b may be provided as a unit.

That is, the upper fork 54 has the first holding mechanism 61 provided on the one surface 54a side, and the first holding mechanism 61 is so provided as to be allowed to hold and support the wafer W from above the wafer W with the surface 54a facing downward. Further, the upper fork 54 has the second holding mechanism 62 provided on the same side as the surface 54a on which the first holding mechanism 61 is provided, and the second holding mechanism 62 is so provided as to be allowed to hold and support the spacer member 35 from above the spacer member 35 with the surface 54a facing downward. In other words, the first holding mechanism 61 and the second holding mechanism 62 are positioned across the upper fork 54 from the lower fork 53.

The first claw parts 61a and the first pressing parts 61b may be so configured as to hold the wafer W by contacting the peripheral edge part of the wafer W on at least three points, and may be so provided that the sum of the number of the first claw parts 61a and the number of the first pressing parts 61b is more than or equal to three. Further, the second claw parts 62a and the second pressing parts 62b may be so configured as to hold the spacer member 35 by contacting the peripheral edge part of the spacer member 35 on at least three points, and may be so provided that the sum of the number of the second claw parts 62a and the number of the second pressing parts 62b is more than or equal to three.

Further, the first holding mechanism 61 includes a first forward and backward driving part 63 configured to drive the first pressing parts 61b to move toward and away from the first claw parts 61a. Further, the second holding mechanism 62 includes a second forward and backward driving part 64 configured to drive the second pressing parts 62b to move toward and away from the second claw parts 62a.

The first pressing parts 61b and the second pressing parts 62b may be formed as a unit. This allows the first forward and backward driving part 63, configured to drive the first pressing parts 61b to move forward and backward, and the second forward and backward driving part 64, configured to drive the second pressing parts 62b to move forward and backward, to be provided together. FIG. 8 through FIGS. 11A through 11C illustrate a case where the first pressing parts 61b and the second pressing parts 62b are formed as a unit and are driven by the same (single) forward and backward driving part 63 (64).

Further, the first holding mechanism 61 may have members other than the first claw parts 61a and the first pressing parts 61b as long as the members allow the wafer W to be held from above the wafer W. Further, the second holding mechanism 62 may have members other than the second claw parts 62a and the second pressing parts 62b as long as the members allow the spacer member 35 to be held from above the spacer member 35.

The support part 71 includes two contact portions 71a. The support part 71 is where the peripheral edge part of the wafer W is placed when holding the wafer W from below the wafer W.

In the case of holding and supporting the wafer W from below the wafer W, the wafer W is held between the first claw parts 61a and the first pressing parts 61b to be horizontally restricted as illustrated in FIGS. 9A and 9B. Further, the lower surface of the wafer W comes into contact with bottom portions 61e of the first claw parts 61a and with the contact portions 71a so that the wafer W is vertically supported. On the other hand, as illustrated in FIGS. 9A and 9C, the wafer W is in contact with neither the second claw parts 62a nor the second pressing parts 62b, and is not held between the second claw parts 62a and the second pressing parts 62b.

In the case of holding and supporting the wafer W from above the wafer W, the wafer W is held between the first claw parts 61a and the first pressing parts 61b to be horizontally restricted as illustrated in FIGS. 10A and 10B. Further, the lower surface of the wafer W comes into contact with flange portions 61c of the first claw parts 61a and with flange portions 61d of the first pressing parts 61b, so that the wafer W is vertically supported. On the other hand, as illustrated in FIGS. 10A and 10C, the wafer W is in contact with neither the second claw parts 62a nor the second pressing parts 62b, and is not held between the second claw parts 62a and the second pressing parts 62b.

In the case of holding and supporting the spacer member 35 from above the spacer member 35, the spacer member 35 is held between the second claw parts 62a and the second pressing parts 62b to be horizontally restricted as illustrated in FIGS. 11A and 11C. Further, the lower surface of the spacer member 35 comes into contact with flange portions 62c of the second claw parts 62a and with flange portions 62d of the second pressing parts 62b so that the spacer member 35 is vertically supported. On the other hand, as illustrated in FIGS. 11A and 11B, since the spacer member 35 is provided with the cut parts 35a and 35b as illustrated in FIG. 6, the spacer member 35 is in contact with neither the first claw parts 61a nor the first pressing parts 61b, and is not held between the first claw parts 61a and the first pressing parts 61b.

Further, the spacer member 35 may have cut parts 35c, cut slightly upward from its bottom surface, formed in portions of the spacer member 35 that come into contact with the flange portions 62c of the second claw parts 62a. This facilitates holding the spacer member 35 placed on the wafer W1 (FIG. 5) from above the spacer member 35 when returning the spacer member 35 to the boat 24 after receiving the double-substrate unit 36 from the boat 24.

Further, the first holding mechanism 61 and the second holding mechanism 62 are so provided that a center position C1 of the wafer W supported by the first holding mechanism 61 and a center position C2 of the spacer member 35 supported by the second holding mechanism 62 are at different positions along the forward-moving and the backward-moving direction of the upper fork 54. This makes it possible to prevent the spacer member 35 from interfering with either the first claw parts 61a or the first pressing parts 61b when holding the spacer member 35 between the second claw parts 62a and the second pressing parts 62b.

When the wafer W is, for example, 300 mm in outside diameter, a distance DC between the center positions C1 and C2 may be, for example, 2 mm.

Here, it is illustrated with reference to FIGS. 12A and 12B, in contrast with a comparative example, that a transfer mechanism according to this embodiment makes it possible to reduce the interval between wafers or spacer members accommodated in a container.

Figure 12A:
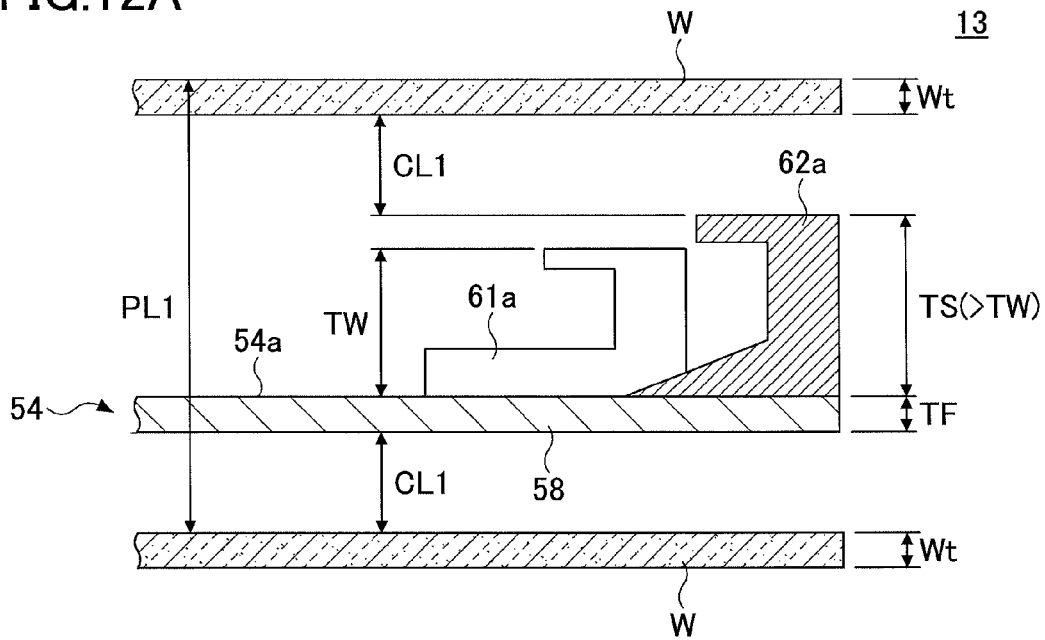
FIGS. 12A and 12B are vertical cross-sectional views comparatively illustrating an end part of the upper fork of the transfer mechanism according to the embodiment and an end part of an upper fork of a transfer mechanism according to a comparative example, respectively.
Figure 12B:
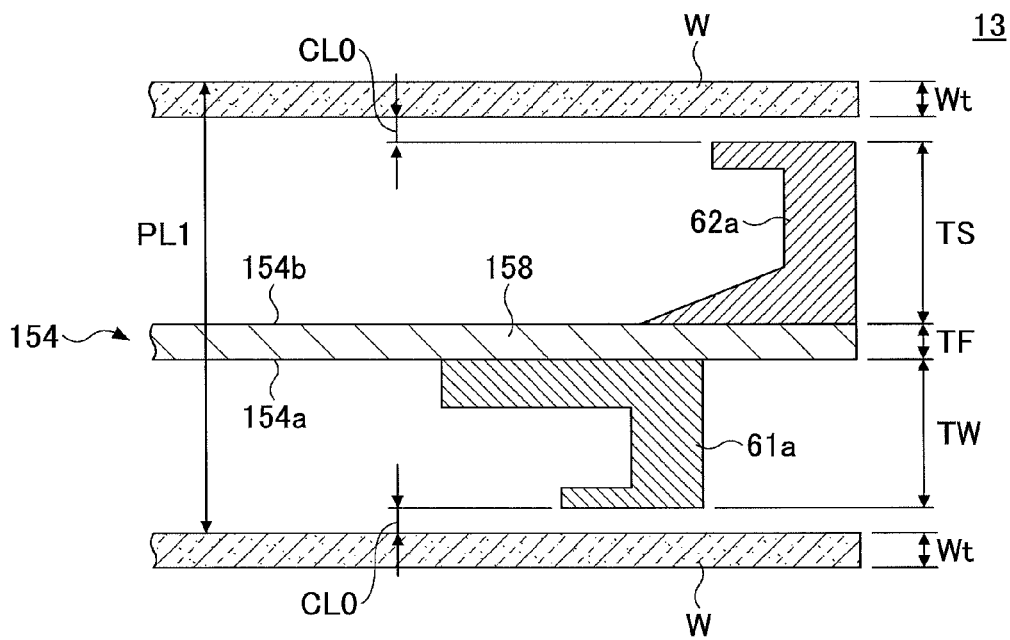

FIGS. 12A and 12B are vertical cross-sectional views comparatively illustrating the end part 58 of the upper fork 54 of the transfer mechanism 27 according to this embodiment and an end part 158 of an upper fork 154 of a transfer mechanism according to a comparative example, respectively.

It is assumed that the thickness of each of the end parts 58 and 158 is TF, the maximum thickness of the first claw parts 61a is TW, and the maximum thickness of the second claw parts 62a is TS. Further, it is assumed that the maximum thickness TS of the second claw parts 62a is greater than the maximum thickness TW of the first claw parts 61a, that is, TS>TW. This is because the thickness of the spacer member 35 of, for example, 1.5 mm is greater than the thickness of the wafer W of, for example, 0.9 mm.

As illustrated in FIG. 12B, the transfer mechanism according to the comparative example has the first claw parts 61a and the second claw parts 62a provided on opposite surfaces 154a and 154b, respectively, of the upper fork 154. Accordingly, the thickness of the upper fork 154 at the end part 158 is TS+TF+TW.

On the other hand, as illustrated in FIG. 12A, the transfer mechanism 27 according to this embodiment has the first claw parts 61a and the second claw parts 62a provided on the same surface 54a of the upper fork 54. Accordingly, the thickness of the upper fork 54 at the end part 58 is TS+TF because TS>TW. That is, it is possible to make the thickness of the upper fork 54 of the transfer mechanism 27 according to this embodiment, (TS+TF), smaller than the thickness of the upper fork 154 of the transfer mechanism according to the comparative example, (TS+TF+TW). Accordingly, it is possible to reduce the intervals between the wafers W in the containers 13 and 14.

Further, in the container 13 that accommodates the wafers W, a certain pitch is predetermined for vertically accommodating the wafers W. Letting the certain pitch be PL1 and letting the thickness of the wafer W be Wt, in the comparative example illustrated in FIG. 12B, a clearance CL0 between the upper fork 154 and each of the wafers W on the upper side and the lower side in the container 13 is (PL1−Wt−(TS+TF+TW))/2. On the other hand, according to this embodiment illustrated in FIG. 12A, a clearance CL1 between the upper fork 54 and each of the wafers W on the upper side and the lower side in the container 13 is (PL1−Wt−(TS+TF))/2, which is greater than the clearance CL0. Thus, it is possible to make the clearance CL1 in the container 13 for the upper fork 54 of the transfer mechanism 27 according to this embodiment greater than the clearance CL0 in the container 13 for the upper fork 154 of the transfer mechanism according to the comparative example.

For example, it is assumed that PL1 is 10 mm, Wt is 0.9 mm, TS+TF+TW in the comparative example is 7.2 mm, and TS+TF in this embodiment is 5.3 mm. In this case, CL0 in the comparative example is 0.95 mm and CL1 in this embodiment is 1.9 mm. Thus, it is possible to make CL1 greater than CL0.

Next, a description is given, with reference to FIGS. 13A through 13U and FIGS. 14A and 14B, of a substrate conveying method for the transfer mechanism 27 constructing and conveying the double-substrate unit 36.

Figure 13G:
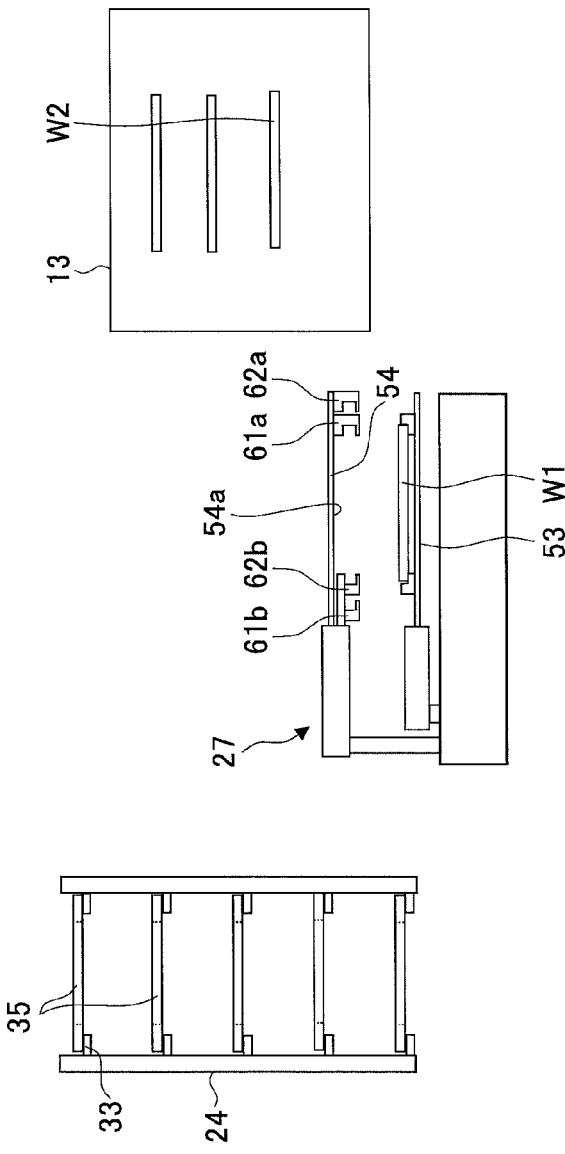
FIGS. 13A through 13U are side views illustrating a process for the transfer mechanism constructing and conveying the double-substrate unit according to the embodiment.
Figure 13H:
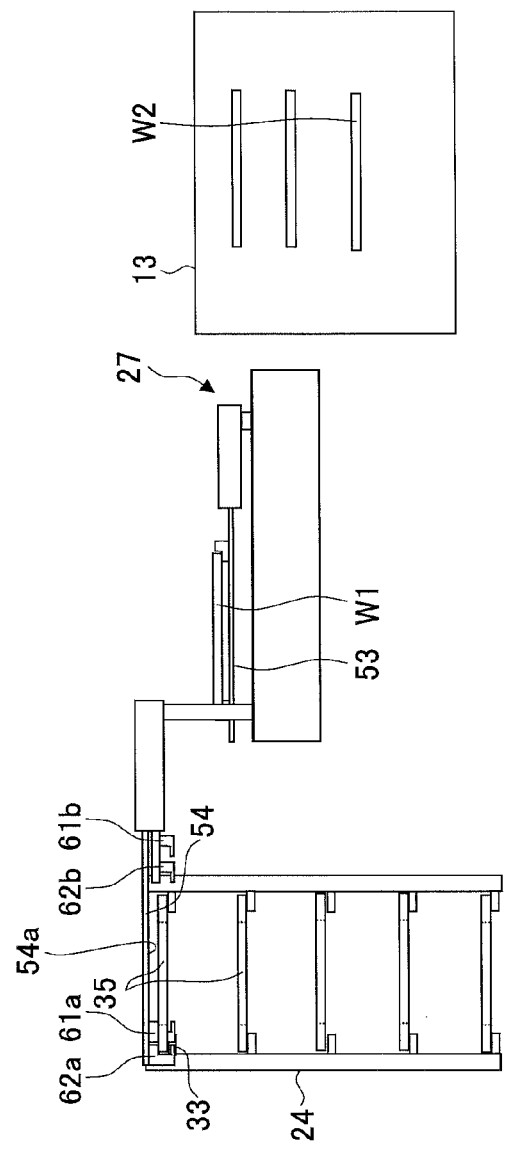
Figure 13M:
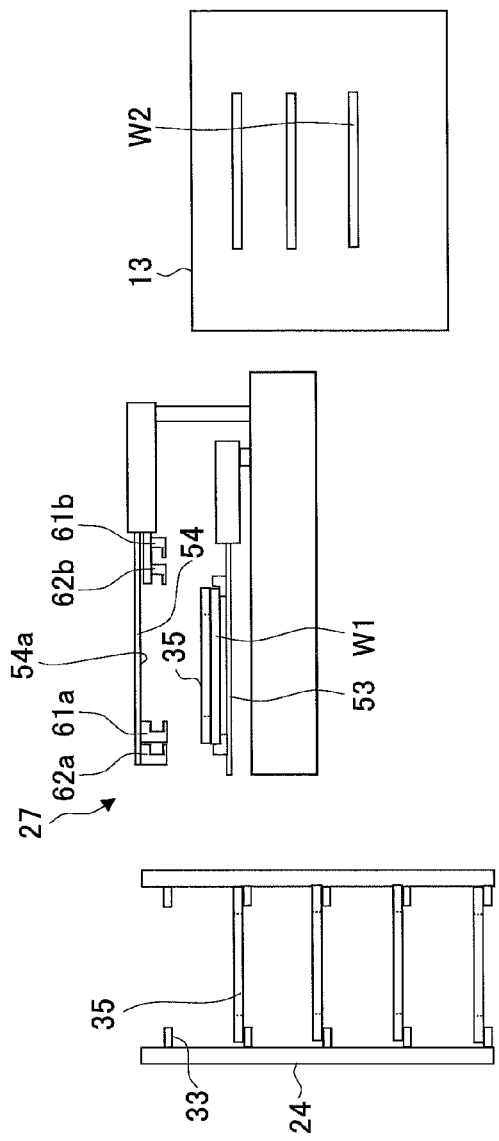
Figure 13N:
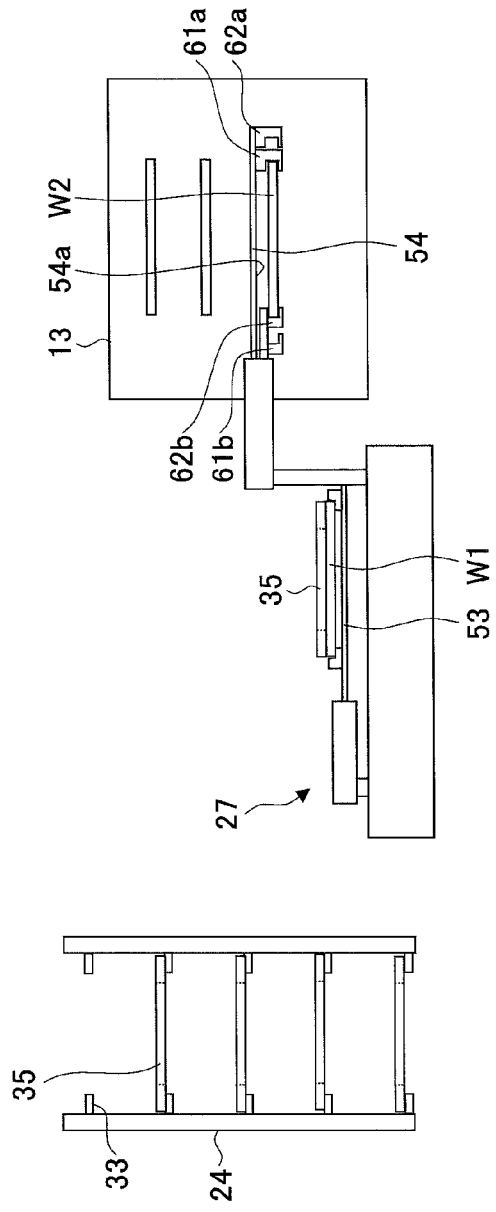
Figure 13O:
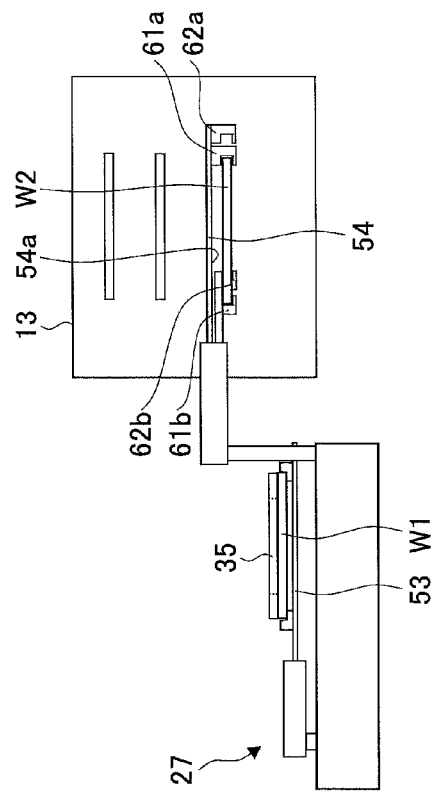
Figure 13P:
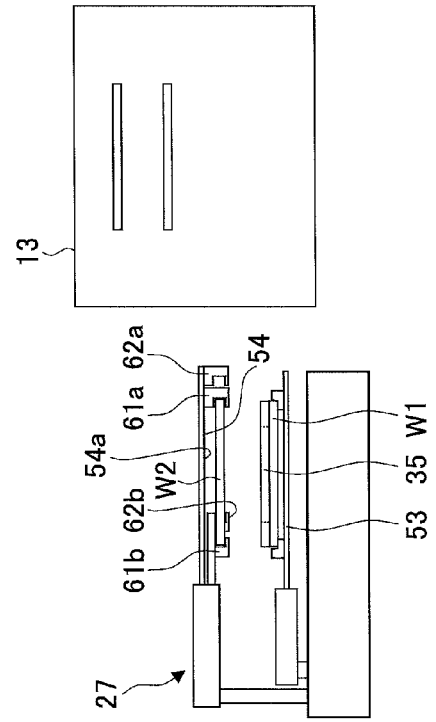
Figure 13Q:
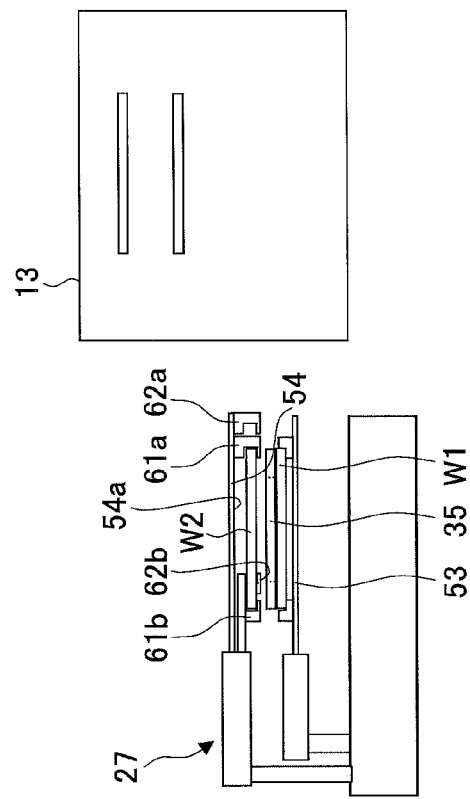
Figure 13R:
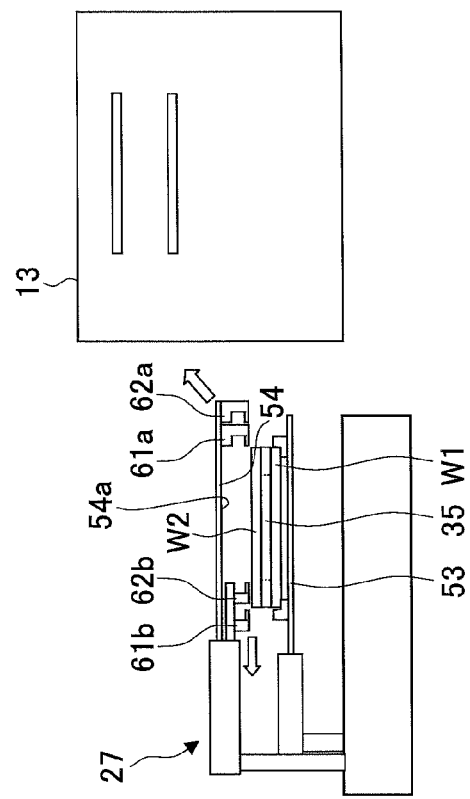
Figure 13U:
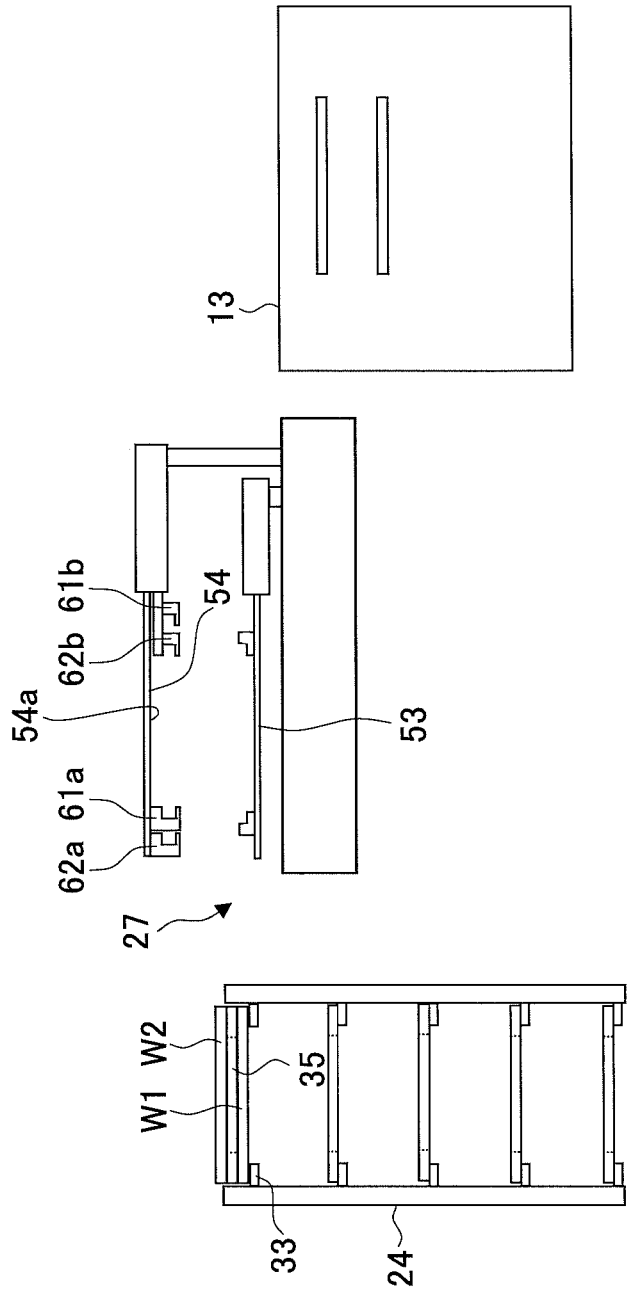
Figure 14A:
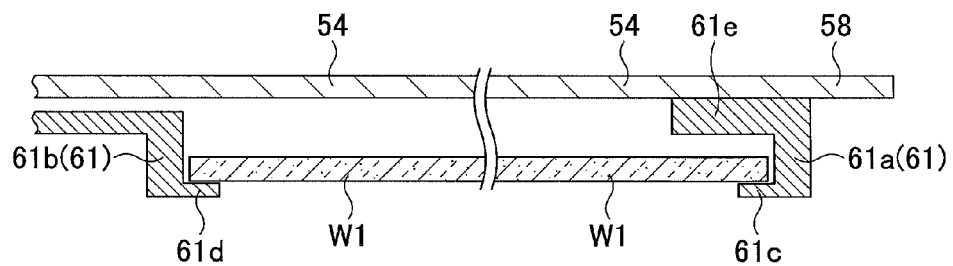
FIGS. 14A and 14B are diagrams illustrating movements of the upper fork and first pressing parts at a time when the upper fork transfers the wafer to a lower fork according to the embodiment.
Figure 14B:
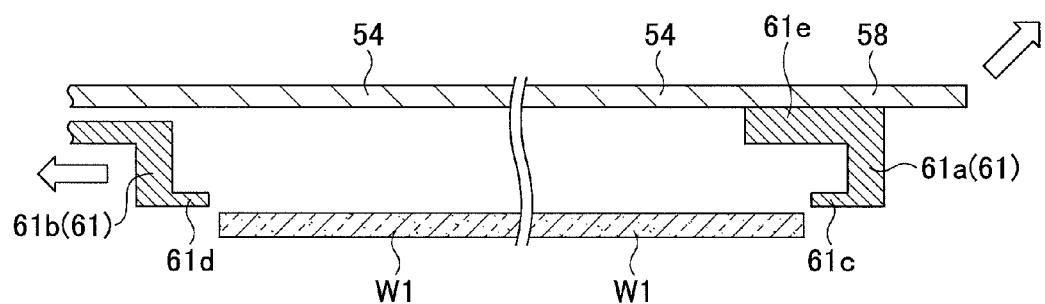

FIG. 13A through FIG. 13U are side views illustrating a process for the transfer mechanism 27 constructing and conveying the double-substrate unit 36. Further, FIGS. 14A and 14B are diagrams illustrating movements of the upper fork 54 and the first pressing parts 61b at a time when the upper fork 54 transfers the wafer W to the lower fork 53. FIG. 14A illustrates a state before the upper fork 54 transfers the wafer W to the lower fork 53, and FIG. 14B illustrates a state after the upper fork 54 transfers the wafer W to the lower fork 53.

First, the upper fork 54 is caused to move forward into the container 13 to receive the wafer W1 by holding and supporting the wafer W1 from below the wafer W1 with the first holding mechanism 61, and the upper fork 54 is caused to move backward and turn upside down to place the wafer W1 on the lower fork 53 (a first step, FIGS. 13A through 13G).

As illustrated in FIG. 13A, the upper fork 54 is caused to move forward, with the surface 54a facing upward, into the container 13 accommodating the wafer W1. At this point, the upper fork 54 is caused to move forward so that the wafer W1 is positioned between the first claw parts 61a and the first pressing parts 61b. Next, as illustrated in FIG. 13B, the first pressing parts 61b are caused to move forward to hold and support the wafer W1 from below the wafer W1 while pressing the wafer W1 toward the first claw parts 61a, thereby receiving the wafer W1. Next, as illustrated in FIG. 13C, the upper fork 54 is caused to move backward from inside the container 13 while supporting the wafer W1. Next, as illustrated in FIG. 13D, the upper fork 54 is caused to turn upside down while supporting the wafer W1. Next, as illustrated in FIG. 13E, the lower fork 53 is caused to move upward to approach the upper fork 54. Next, as illustrated in FIG. 13F, the first pressing parts 61b are caused to move backward to place the wafer W1 on the lower fork 53. Next, as illustrated in FIG. 13G, the lower fork 53 is caused to move downward to its original position.

Before the upper fork 54 transfers the wafer W1 to the lower fork 53, the wafer W1 is held between the first claw parts 61a and the first pressing parts 61b as illustrated in FIG. 14A. When the upper fork 54 transfers the wafer W1 to the lower fork 53, at the same time with causing the first pressing parts 61b to move backward, the upper fork 54 may be caused to slightly move forward by the movable body 56 (FIG. 8) and the transfer mechanism 27 may be caused to slightly move upward by the elevation mechanism 52 as illustrated in FIG. 14B. This makes it possible to prevent the wafer W1 from being caught on either the first claw parts 61a or the first pressing parts 61b when the wafer W1 is transferred to the lower fork 53. The spacer member 35 and the wafer W2 may be transferred from the upper fork 54 to the lower fork 53 in the same manner. (See FIGS. 13L and 13R.)

As described above, instead of the lower fork 53, the upper fork 54 may be so provided as to be vertically movable relative to the base 51. In this case, the upper fork 54 may be caused to move downward to approach the lower fork 53 and place the wafer W1 on the lower fork 53 by causing the first pressing parts 61b to move backward, and thereafter, be caused to move upward to its original position. The spacer member 35 and the wafer W2 may be transferred from the upper fork 54 to the lower fork 53 in the same manner. (See FIGS. 13L and 13R.)

Next, the upper fork 54 is caused to move forward into the boat 24 to receive the spacer member 35 by holding and supporting the spacer member 35 from above the spacer member 35 with the second holding mechanism 62, and the upper fork 54 is caused to move backward and place the spacer member 35 on the wafer W1 placed on the lower fork 53 (a second step, FIGS. 13H through 13M).

As illustrated in FIG. 13H, the upper fork 54 is caused to move forward, with the surface 54a facing downward, into the boat 24 holding the spacer member 35 on the claw parts 33. At this point, the upper fork 54 is caused to move forward so that the spacer member 35 is positioned between the second claw parts 62a and the second pressing parts 62b. Next, as illustrated in FIG. 13I, the second pressing parts 62b are caused to move forward to hold and support the spacer member 35 from below the spacer member 35 while pressing the spacer member 35 toward the second claw parts 62a, thereby receiving the spacer member 35. Next, as illustrated in FIG. 13J, the upper fork 54 is caused to move backward from inside the boat 24 while supporting the spacer member 35. Next, as illustrated in FIG. 13K, the lower fork 53 is caused to move upward to approach the upper fork 54. Next, as illustrated in FIG. 13L, the second pressing parts 62b are caused to move backward to place the spacer member 35 on the wafer W1 placed on the lower fork 53. Next, as illustrated in FIG. 13M, the lower fork 53 is caused to move downward to its original position.

In the second step, the spacer member 35 is received when the center position C2 (FIG. 11A) of the spacer member 35 supported by the second holding mechanism 62 is at a position different from the center position C1 (FIG. 11A) of the wafer W1 supported by the first holding mechanism 61 along the forward-moving and the backward-moving direction of the upper fork 54. This makes it possible to prevent the spacer member 35 from interfering with either the first claw parts 61a or the first pressing parts 61b when holding the spacer member 35 between the second claw parts 62a and the second pressing parts 62b.

Next, the upper fork 54 is caused to move forward into the container 13 to receive the wafer W2 by holding and supporting the wafer W2 from above the wafer W2 with the first holding mechanism 61, and the upper fork 54 is caused to move backward and place the wafer W2 on the spacer member 35 placed over the lower fork 53 (a third step, FIGS. 13N through 13S).

As illustrated in FIG. 13N, the upper fork 54 is caused to move forward, with the surface 54a facing downward, into the container 13 accommodating the wafer W2. At this point, the upper fork 54 is caused to move forward so that the wafer W2 is positioned between the first claw parts 61a and the first pressing parts 61b. Next, as illustrated in FIG. 13O, the first pressing parts 61b are caused to move forward to hold and support the wafer W2 from below the wafer W2 while pressing the wafer W2 toward the first claw parts 61a, thereby receiving the wafer W2. Next, as illustrated in FIG. 13P, the upper fork 54 is caused to move backward from inside the container 13 while supporting the wafer W2. Next, as illustrated in FIG. 13Q, the lower fork 53 is caused to move upward to approach the upper fork 54. Next, as illustrated in FIG. 13R, the first pressing parts 61b are caused to move backward to place the wafer W2 on the spacer member 35 placed over the lower fork 53. Next, as illustrated in FIG. 13S, the lower fork 53 is caused to move downward to its original position.

Next, the lower fork 53 is caused to move forward into the boat 24 and transfer the double-substrate unit 36 to the claw parts 33 (a fourth step, FIGS. 13T and 13U).

As illustrated in FIG. 13T, the lower fork 53 is caused to move forward into the boat 24 to transfer the double-substrate unit 36, formed of the wafer W1, the spacer member 35, and the wafer W2, to the claw parts 33 from which the spacer member 35 was transferred to the upper fork 54 in the second step. Next, as illustrated in FIG. 13U, the lower fork 53 is caused to move backward from inside the boat 24.

Further, in the substrate conveying method according to this embodiment, the spacer members 35 may be aligned at the same rotational angle inside the housing 18 using, for example, the aligning unit 15 (an aligning step). As described below, this eliminates the necessity of a process for aligning the spacer members 35 at the same rotational angle outside the housing 18.

Figure 15:
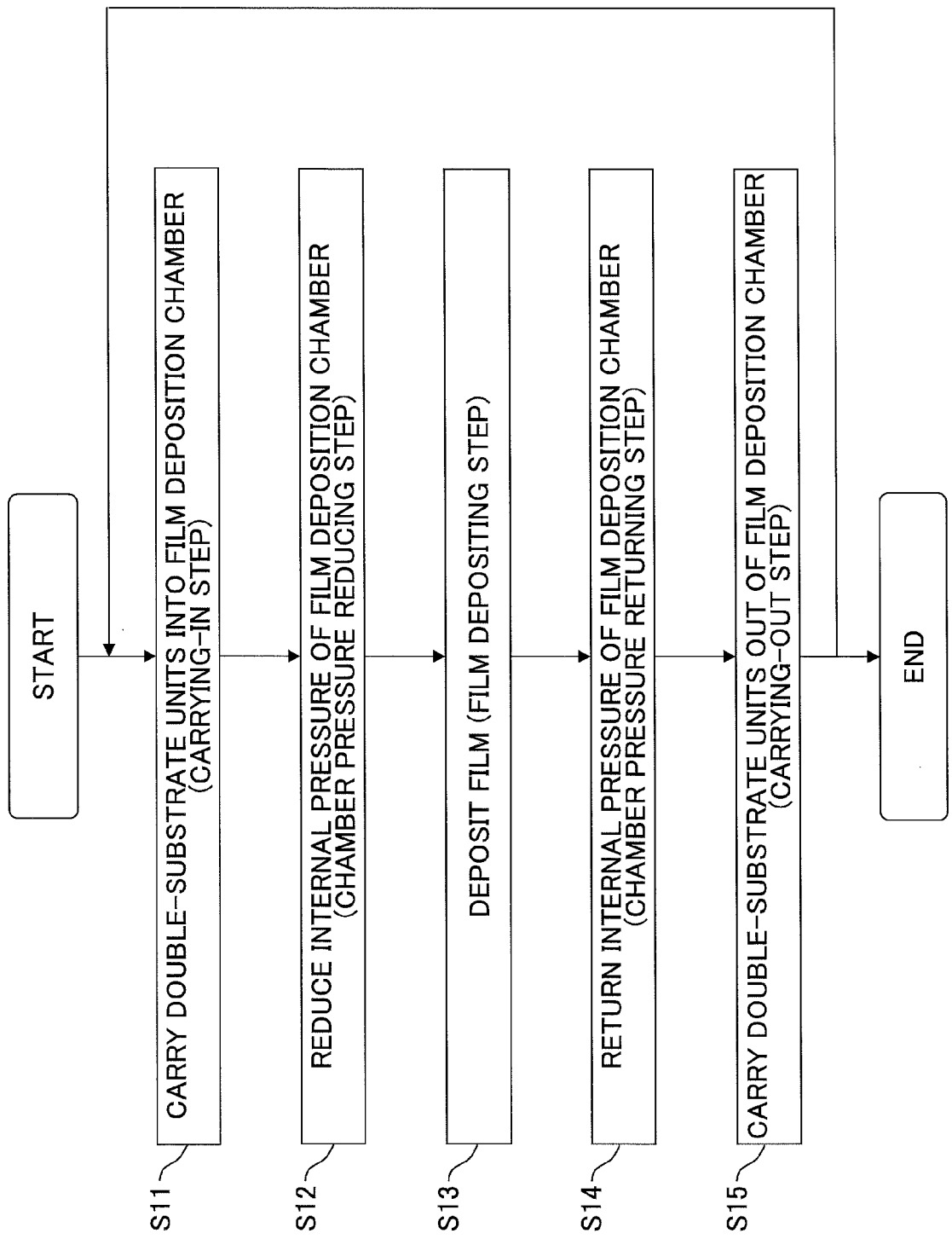
FIG. 15 is a flowchart for illustrating the processes of steps including a film deposition process using the film deposition apparatus according to the embodiment.

Next, a description is given, with reference to FIG. 15 as well as FIG. 1 through FIG. 7, of a film deposition process using a film deposition apparatus according to this embodiment. FIG. 15 is a flowchart for illustrating the processes of steps including a film deposition process using a film deposition apparatus according to this embodiment.

After the start of a film deposition process, in step S11, the double-substrate units 36 are carried into the film deposition chamber 40 (a carrying-in step). In the case of the film deposition apparatus 10 illustrated in FIG. 1 through FIG. 4, for example, in the loading area 20, the double-substrate units 36 may be loaded into the boat 24a with the transfer mechanism 27 and the boat 24a loaded with the double-substrate units 36 may be placed on the lid body 23 with the boat conveying mechanism 25c. Then, the lid body 23 on which the boat 24a is placed is caused to move upward by the elevation mechanism 26 to be inserted into the film deposition chamber 40, so that the double-substrate units 36 are carried into the film deposition chamber 40. The wafers W may be transferred from the containers 13 and 14 to the boat 24a (by interposing the spacer members 35) through the process described above using FIGS. 13A through 13U.

Next, in step S12, the internal pressure of the film deposition chamber 40 is reduced (a pressure reducing step). By controlling the exhaust capability of the exhaust device 48 or a flow regulating valve, which is not graphically illustrated, provided between the exhaust device 48 and the exhaust pipe 49, the amount by which the film deposition chamber 40 is evacuated via the exhaust pipe 49 is increased. The internal pressure of the film deposition chamber 40 is reduced from a predetermined pressure such as an atmospheric pressure (760 Torr) to, for example, 0.3 Torr.

Next, in step S13, a polyimide film is deposited (a film depositing step).

A first flow rate F1 at which the first source gas (PMDA gas) is caused to flow to the injector 45c and a second flow rate F2 at which the second source gas (ODA gas) is caused to flow to the injector 46c are determined in advance or in step S13 by the control part 50. PMDA gas is caused to flow from the first source gas feeding part 45 to the injector 45c at the determined first flow rate F1 and ODA gas is caused to flow from the second source gas feeding part 46 to the injector 46c at the determined first flow rate F2 while the wafers W are being rotated by the rotation mechanism 29. Thereby, the PMDA gas and the ODA gas are mixed at a predetermined mixture ratio and fed into the film deposition chamber 40. PMDA and ODA are subjected to a polymerization reaction on the top surfaces of the wafers W so that a polyimide film is deposited on the top surfaces of the wafers W. Specifically, for example, the first flow rate F1 may be 900 sccm and the second flow rate F2 may be 900 sccm.

The polymerization reaction of PMDA and ODA at this point follows the following formula (1).

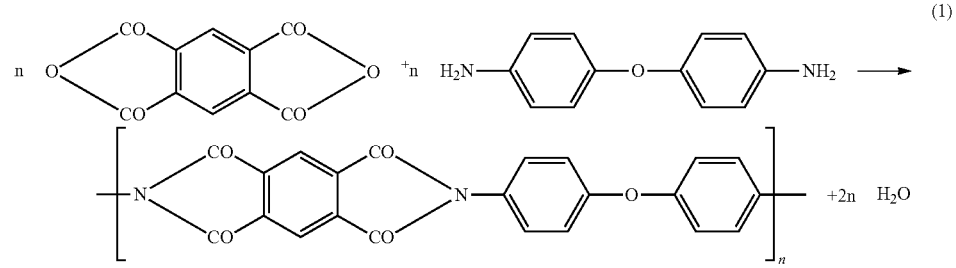

According to this embodiment, multiple wafers W may be held so that the interval between vertically adjacent two of the wafers W with their respective bottom surfaces facing each other is narrower than the interval between vertically adjacent two of the wafers W with their respective top surfaces facing each other. This makes it possible to increase the interval between vertically adjacent two of the wafers W with their respective top surfaces facing each other while the number of wafers loadable in the boat 24 remains the same. As a result, it is possible to increase the gap between the top surface of one of the wafers W and the top surface of another one of the wafers W, so that it is possible to feed a sufficient amount of source gases onto the top surfaces of the wafers W.

Next, in step S14, the feeding of the PMDA gas from the first source gas feeding part 45 and the feeding of the ODA gas from the second source gas feeding part 46 are stopped, and the internal pressure of the film deposition chamber 40 is returned to an atmospheric pressure (a pressure returning step). By controlling the exhaust capability of the exhaust device 48 or the flow regulating valve, which is not graphically illustrated, provided between the exhaust device 48 and the exhaust pipe 49, the amount by which the film deposition chamber 40 is evacuated via the exhaust pipe 49 is reduced. The internal pressure of the film deposition chamber 40 is returned from, for example, 0.3 Torr to, for example, an atmospheric pressure (760 Torr).

Next, in step S15, the double-substrate units 36 are carried out of the film deposition chamber 40 (a carrying-out step). In the case of the film deposition apparatus 10 illustrated in FIG. 1 through FIG. 4, for example, the lid body 23 on which the boat 24a is placed may be caused to move downward by the elevation mechanism 26 to be carried out from inside the film deposition chamber 40 to the loading area 20. Then, the wafers W are transferred from the boat 24a placed on the carried-out lid body 23 to the container 13 by the transfer mechanism 27. Thereby, the double-substrate units 36 are carried out of the film deposition chamber 40. The wafers W may be transferred from the boat 24a to the container 13 through a process reverse to the process described using FIGS. 13A through 13U, through which the wafers W are transferred from the container 13 to the boat 24a. At this point, the spacer members 35 are returned into the boat 24a to be held by the claw parts 33 of the boat 24a. Thereafter, the film deposition process ends.

In the case of successively subjecting multiple batches to a film deposition process, a further transfer of the wafers W from the container 13 to the boat 24 is performed in the loading area 20 by the transfer mechanism 27, and the process returns again to step S11 to subject the next batch to a film deposition process.

According to this embodiment, the boat 24 holds the spacer members 35 instead of the double-substrate units 36 when not holding the double-substrate units 36.

It is assumed that when the film deposition process is not performed, the spacer members 35 are accommodated in the container (hereinafter referred to as "spacer member container") 14 provided outside the housing 18 and the wafers W are accommodated in the containers (hereinafter referred to as "wafer containers") 13. In this case, one of the door mechanisms 21 that cause the wafer containers 13 to communicate with the housing 18 is connected to the spacer member container 14, so that the number of door mechanisms 21 to be connected to the wafer containers 13 is reduced. This results in generation of wait time for switching the wafer containers 13, thus resulting in a longer conveyance time.

For example, a first one of the wafer containers 13 is caused to communicate with the housing 18 by one of the door mechanisms 21, and the communication with the housing 18 is cut off by the one of the door mechanisms 21 after the wafers W are transferred from the first one of the wafer containers 13. Then, the first one of the wafer containers 13 is replaced with the next one of the wafer containers 13, and the next one of the wafer containers 13 is caused to communicate with the housing 18 through the one of the door mechanisms 21 to transfer the wafers W from the next one of the wafer containers 13. At this point, after cutting off the communication between the first one of the wafer containers 13 and the inside of the housing 18, a wait time is generated before the next one of the wafer containers 13 is caused to communicate with the housing 18 to have the wafers W ready for conveyance, thus resulting in a longer conveyance time.

In particular, when the double-substrate unit 36 is composed of two wafers W and a single spacer member 35, the number of wafers W conveyed is, for example, twice the number of spacer members 35 conveyed. This results in an increase in the proportion of a wait time for switching the wafer containers 13 for communication through the same door mechanism 21 at the time of storing the spacer members 35 in the spacer member container 14.

Likewise, the conveyance time becomes longer also in the case where the wafers W are wafers for monitoring or wafers for testing instead of wafers for film deposition.

On the other hand, according to this embodiment, the spacer members 35 are accommodated in the boat 24 provided inside the housing 18. Therefore, there is no decrease in the number of door mechanisms 21 to be connected to the wafer containers 13. Accordingly, it is possible to cause the next one of the wafer containers 13 to communicate with the housing 18 through another one of the door mechanism 21 before cutting off the communication between the first one of the wafer containers 13 and the inside of the housing 18 through the one of the door mechanisms 21, so that it is possible to reduce conveyance time.

Further, in the case of storing the spacer members 35 in the spacer member container 14, it would be necessary for the film deposition apparatus 10 to have the spacer member container 14 in addition to the wafer containers 13, thus resulting in an increase in the number of components. Further, it would be necessary to provide a stocker for accommodating the spacer member container 14 in part of the film deposition apparatus 10 other than the placement table 12, thus resulting in an increase in the installation area or the overall size of the film deposition apparatus 10.

On the other hand, according to this embodiment, the spacer members 35 are accommodated in the boat 24 provided inside the housing 18. Therefore, there is no need to provide the film deposition apparatus 10 with the spacer member container 14, so that it is possible to reduce the number of components. Further, it is also possible to reduce the installation area or the overall size of the film deposition apparatus 10.

Further, the spacer members 35 may be subjected to cleaning by being subjected to heat treatment while being held in the boat 24. If the spacer members 35 are stored in the spacer member container 14, it is necessary to convey the spacer member 35 from the spacer member container 14 to the boat 24 every time the spacer members 35 are subjected to cleaning, thus resulting in a longer cleaning time.

On the other hand, according to this embodiment, the spacer members 35 are accommodated in the boat 24 provided inside the housing 18. Therefore, there is no need to convey the spacer members 35 from the spacer member container 14 to the boat 24 every time cleaning is performed, so that it is possible to reduce cleaning time.

Further, when a film deposition process is executed multiple times so that the spacer members 35 are used multiple times in a row, the spacer members 35 may be prevented from being conveyed because rotational angular displacements of the spacer members 35 due to thermal expansion and/or the transfer mechanism 27 accumulate to go beyond a tolerable range. In this case, it would be necessary to return the spacer members 35 into the spacer member container 14 to align the spacer members 35 at the same rotational angle outside the housing 18.

On the other hand, according to this embodiment, the spacer members 35 may be aligned at the same rotational angle inside the housing 18 by the aligning mechanism as described above. This eliminates the necessity of aligning the spacer members 35 at the same rotational angle outside the housing 18.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

In the above-described embodiment, a description is given of the case where the transfer mechanism 27 is configured to transfer the double-substrate units 36 to the boat 24 of the film deposition apparatus 10. However, the transfer mechanism 27 may be any transfer mechanism as long as the transfer mechanism 27 is allowed to hold the double-substrate units 36 at predetermined vertical intervals and to convey the double-substrate units 36 to a substrate holding part that holds the spacer members 35 when not holding the double-substrate units 36. Accordingly, the transfer mechanism 27 may be configured to transfer the double-substrate units 36 to the substrate holding parts of various substrate processing apparatuses other than the boat 24 of the film deposition apparatus 10.

What is claimed is:

1. A substrate conveying method conveying a layered body having a first substrate and a second substrate stacked in layers with a spacer member provided between respective bottom surfaces thereof facing each other, the substrate conveying method comprising:
   receiving the first substrate accommodated in an accommodating part by holding the first substrate from below the bottom surface thereof using a first holding mechanism provided on a side of a first fork provided on a turnable base so as to be positioned above a second fork provided on the turnable base, and turning the first fork upside down and placing the received first substrate on the second fork;
   receiving the spacer member held in a substrate holding part by holding the spacer member from above the spacer member using a second holding mechanism provided on the same side of the first fork as the first holding mechanism, and placing the received spacer member on the first substrate placed on the second fork; and
   holding the second substrate accommodated in the accommodating part from above a top surface thereof using the first holding mechanism, and placing the received second substrate on the spacer member placed over the second fork.

2. The substrate conveying method as claimed in claim 1, wherein:
   said holding the first substrate holds the first substrate between a first claw part and a first pressing part of the first holding mechanism by pressing the first substrate toward the first claw part by the first pressing part, the first claw part being fixed to a distal end part of the first fork, the first pressing part being so provided on a proximal end side of the first fork as to be movable toward and away from the first claw part;
   said holding the spacer member holds the spacer member between a second claw part and a second pressing part of the second holding mechanism by pressing the spacer member toward the second claw part by the second pressing part, the second claw part being fixed to the distal end part of the second fork, the second pressing part being so provided on the proximal end side of the second fork as to be movable toward and away from the second claw part; and
   said holding the second substrate holds the second substrate between the first claw part and the first pressing part of the first holding mechanism by pressing the first substrate toward the first claw part by the first pressing part.

3. The substrate conveying method as claimed in claim 1, wherein said holding the spacer member holds the spacer member from above the spacer member so that the spacer member supported by the second holding mechanism is eccentric to the first substrate supported by the first holding member in said holding the first substrate and the second substrate supported by the first holding member in said holding the second substrate.

4. The substrate conveying method as claimed in claim 1, further comprising:
   aligning the spacer member and an additional spacer member at a same rotational angle inside a housing in which the substrate holding part is provided,
   wherein the accommodating part is provided outside the housing.

5. The substrate conveying method as claimed in claim 1, wherein the spacer member has a ring shape.

6. The substrate conveying method as claimed in claim 1, wherein the substrate holding part holds the layered body and an additional layered body so that a first interval between vertically adjacent two of the first and second substrates with bottom surfaces thereof facing each other is narrower than a second interval of vertically adjacent two of the first and second substrates with top surfaces thereof facing each other.

7. The substrate conveying method as claimed in claim 1, further comprising:
   causing one of the first fork and the second fork to vertically move toward and approach another one of the first fork and the second fork in at least one of said placing the received first substrate on the second fork, said placing the received spacer member on the first substrate placed on the second fork, and said placing the received second substrate on the spacer member placed over the second fork.

8. The substrate conveying method as claimed in claim 7, further comprising:
   causing the first fork and the second fork to vertically move together by an elevation mechanism.

* * * * *